United States Patent [19]
Taniguchi et al.

[11] Patent Number: 6,066,958
[45] Date of Patent: May 23, 2000

[54] SEMICONDUCTOR INTEGRATED CIRCUIT

[75] Inventors: Hideki Taniguchi; Yoichi Goi, both of Tokyo, Japan

[73] Assignee: Mitsubishi Denki Kabushiki Kaisha, Tokyo, Japan

[21] Appl. No.: 09/195,193

[22] Filed: Nov. 18, 1998

[30] Foreign Application Priority Data

Jun. 3, 1998 [JP] Japan .................................. 10-154540

[51] Int. Cl.⁷ ........................ H03K 19/003; H03K 17/16; H03K 19/094
[52] U.S. Cl. .................................. 326/27; 326/87; 326/57
[58] Field of Search ............................ 326/56–58, 82–83, 326/86–87, 26–27

[56] References Cited

U.S. PATENT DOCUMENTS

| | | | |
|---|---|---|---|
| 5,122,690 | 6/1992 | Bianchi | 326/87 |
| 5,751,160 | 5/1998 | Baek et al. | 326/27 |
| 5,773,999 | 6/1998 | Park et al. | 327/108 |
| 5,877,647 | 3/1999 | Vajapey et al. | 327/391 |
| 5,955,891 | 9/1999 | Makino et al. | 326/33 |

FOREIGN PATENT DOCUMENTS 1-34016  2/1989  Japan .

*Primary Examiner*—Michael Tokar
*Assistant Examiner*—James A. Cho
*Attorney, Agent, or Firm*—McDermott, Will & Emery

[57] ABSTRACT

There are provided an output buffer circuit and an input/output buffer circuit each including pre-driver circuit and main driver circuit divided to a plurality of stages and a delay circuit and enabling operations of the main driver circuit successively with a delay circuit in the pre-driver circuit.

6 Claims, 17 Drawing Sheets

SEMICONDUCTOR INTEGRATED CIRCUIT

FIELD OF THE INVENTION

The present invention relates to a semiconductor integrated circuit having a complementary metal oxide semiconductor element (CMOS) structure and comprising an output buffer circuit and an input/output buffer circuit.

BACKGROUND OF THE INVENTION

In association with increase in an operating speed of circuits, noise caused due to inductance of inner lead or bonding wires or the like of the package is creating a problem. A reverse electromotive force that is a product of a time-related change rate of a current and self inductance is generated. The reverse electromotive force creates noise in the power supply potential or a ground potential. FIG. 15 is a circuit diagram showing configuration of an output buffer circuit that reduces the generation of noise as described above in a conventional type of semiconductor integrated circuit. In FIG. 15, designated at the reference numeral 1 is an input terminal into which an output signal IN1 from an internal circuit is inputted. The numeral 2' is an output terminal, 5 is a power supply potential, 6 is a ground potential, P1 to P4 are P-channel type metal oxide semiconductor transistor (described as PMOS transistor hereinafter), N1 to N4 are N-channel type metal oxide semiconductor transistor (described as NMOS transistor hereinafter), 9a is a pre-driver circuit and 10a is a main driver circuit.

Source electrode of the PMOS transistor P1 of the pre-driver circuit 9a is connected to the power supply potential 5, gate electrode is connected to the input terminal 1 and drain electrode is connected to a node np0. Source electrode of the NMOS transistor N2 is connected to the ground potential 6, gate electrode connected to the input terminal 1 and drain electrode is connected to the source electrode of NMOS transistor N1. The gate electrode of NMOS transistor N1 is connected to the input terminal 1 and drain electrode is connected to the node np0. This forms an inverter for driving a gate electrode of a PMOS transistor P4 of the main driver circuit 10a. Source electrode of the PMOS transistor P2 is connected to the power supply potential 5, gate electrode is connected to the input terminal 1 and drain electrode is connected to a source electrode of PMOS transistor P3. Gate electrode of PMOS transistor P3 is connected to the input terminal 1 and drain electrode is connected to the node nn0. Source electrode of NMOS transistor N2 is connected to the ground potential 6, a gate electrode is connected to the input terminal 1 and drain electrode is connected to the node nn0. This forms an inverter for driving a gate electrode of a NMOS transistor N4 of the main driver circuit 10a.

Source electrode of the PMOS transistor P4 of the main driver circuit 10a is connected to the power supply potential 5, gate electrode is connected to the node np0 and drain electrode is connected to the output terminal 2'. Source electrode of NMOS transistor N4 is connected to the ground potential 6, gate electrode is connected to the node nn0 and drain electrode is connected to the output terminal 2'.

In the conventional type of circuit as shown in FIG. 15, MOS transistors N1 and P3 are provided in an ordinary output buffer circuit to suppress a through rate (time differential of an output voltage) of an output signal to a certain value or less for reducing noise. Namely, between the main driver circuit 10a provided in a final output state so that the DC characteristics of an output buffer circuit is not affected and the pre-driver circuit 9a provided before the main driver circuit 10a, a gradient is applied to a signal by making use of ON resistance of the MOS transistor provided for noise reduction to achieve a reduction in the noise.

More specifically, when the potential at output terminal 2' shifts from "L" or "H", shift of a voltage level at the node np0 is, as shown in FIG. 17A, expressed by a curve with the gradient from "H" to "L" becoming dull due to ON resistance of the NMOS transistor N1 connected in series thereto for noise reduction. On the other hand, a shift of a voltage level to "L" level at the node nn0 is quickly executed by the NMOS transistor N3. For this reason, potential at the output voltage 2' quickly shifts from "L" to "H".

When the potential at output terminal 2' shifts from "H" to "L", shift of a voltage level at the node np0 is, as shown in FIG. 17B, executed quickly by the PMOS transistor P1 from "L" to "H". On the other hand, shift of a voltage level at the node nn0 is expressed with a curve with the gradient from "L" to "H" becoming gentler due to ON resistance of the PMOS transistor P3 connected in series for noise reduction. For this reason, potential at the output terminal 2' shifts gradually from "H" to "L". In either case of output voltage shifting from "L" to "H" or from "H" to "L", by making smaller a time change ratio of di/dt of a charge or discharge current to or from a loaded capacity with the MOS transistors N1 and P3 each for noise reduction for in turn making smaller a reverse electromotive force decided by a product of self inductance in a bonding wire, package inner lead or the like and di/dt, it is possible to reduce noise in power supply potential or ground potential generated by the reverse electromotive force.

FIG. 16 is a circuit diagram showing other configuration of an output buffer circuit designed to reduce generation of noise in the conventional type of semiconductor integrated circuit. In FIG. 16, designated at the reference 1 is an input terminal into which an output signal IN1 from an internal circuit is inputted. 2' is an output terminal, 3 is an input/output control terminal for receiving an input/output control signal IN2 from the internal circuit, 5 is a power supply potential, 6 is a ground potential, P4 to P14 are PMOS transistors, N4 to N14 are NMOS transistors, np1 to np3 and nn1 to nn3 are nodes, 8a is an output state control circuit, 9b is a pre-driver circuit and 10a is a main driver circuit.

The output state control circuit 8a comprises an inverter in turn comprising a PMOS transistor P5 having a source electrode connected to the power supply potential 5 and a gate electrode connected to the input/output control terminal 3 and a NMOS transistor N5 having source electrode connected to the ground potential 6 and a gate electrode connected to the input/output control terminal 3. There is a two-input NAND gate in turn comprising a PMOS transistor P6 having a source electrode connected to the power supply point 5, gate electrode connected to the input terminal 1 and drain electrode connected to the node np1; a PMOS transistor P7 having a source electrode connected to the power supply potential 5, gate electrode connected to an output terminal of said inverter and drain electrode connected to the node np1; a NMOS transistor N7 having a source electrode connected to the ground potential 6 and a gate electrode connected to an output terminal of the inverter; and a NMOS transistor N6 having a source electrode connected to a drain electrode of the NMOS transistor N7, gate electrode connected to the input terminal 1 and drain electrode connected to the node np1. There is a two-input NOR gate in turn comprising PMOS transistor P8 having a source electrode connected to the power potential 5 and a gate electrode connected to the input/output control terminal 3; a PMOS transistor P9 having a source electrode connected to a drain electrode of the PMOS transistor 8, gate electrode connected to the input terminal 1 and drain electrode connected to the node nn1; a NMOS transistor N8 having a source electrode connected to the ground potential 6, gate electrode connected to the input terminal 1 and drain electrode connected to the node nn1, and a NMOS transistor N9 having a source electrode connected to the ground potential 6, gate electrode connected to the input/output control terminal 3 and drain electrode connected to the node nn1.

The pre-driver circuit 9b shown in FIG. 16 shows configuration in which, in comparison to the pre-driver circuit 9a of FIG. 15, an inverter comprising PMOS transistor P10 and NMOS transistor N10 is inserted into a signal flow path between the nodes np1 and np2 and an inverter comprising PMOS transistor P11 and NMOS transistor N11 is inserted into a signal flow path between the nodes nn1 and nn2.

The main driver circuit. 10a comprises a PMOS transistor P4 having a source electrode connected to the power supply potential 5, gate electrode connected to the node np3 and drain electrode connected to the output terminal 2'; and a NMOS transistor N4 having a source electrode connected to the ground potential 6, gate electrode connected to the node nn3 and drain electrode connected to the output terminal 2'.

In the conventional type of circuit shown in FIG. 16, if the input/output control signal IN2 is at "H" level, the contact np1 of the output state control circuit 8a is "H" level (power supply potential) and the node nn1 is at "L" level (ground potential) regardless of whether the output signal IN1 is at "L" level or at "H" level. Then both the PMOS transistor P4 and NMOS transistor N4 in the main driver circuit 10a are turned OFF and the main driver circuit 10a is set in a high impedance state against the output terminal 2'.

On the other hand, if the input/output control signal IN2 is at "L" level, when the ouput signal IN1 is at "H" level, output from the output state control circuit 8a is set in "L" level at both the nodes np1 and nn1. Then, via the pre-driver circuit 9a in the latter stage, "L" level is given to the gate electrodes of PMOS transistor P4 and NMOS transistor N4 in the main driver circuit 10a in the final stage with the PMOS transistor P4 turned ON and further the NMOS transistor N4 turned OFF, and "H" level is outputted to the output terminal 2'.

If the output control signal is at "L" level, when the output signal is at "L" level, output from the output state control circuit 8a is set in "H" level at both the nodes np1, nn1. And, via pre-driver circuit 9b in the latter stage, "H" level is given to the gate electrodes of both PMOS transistor P4 and NMOS transistor N4, the PMOS transistor P4 is turned OFF and NMOS transistor N4 is turned ON, and "L" level outputted to the output terminal 2'.

In the example shown in Fig. 16, like in the example shown in FIG. 15, a certain gradient is applied to a signal in a pre-driver circuit to make a voltage shift time at the output terminal gentler in order to reduce the noise.

As described above, in the conventional type of circuit, by inserting a MOS transistors for noise reduction into one of inverters provided in the pre-driver circuit, a certain gradient is given to a signal by using the ON resistance, and as a result a voltage shift time at the output terminal can be made gentler. Because of this feature, noise caused by the excessive current which is generated due to a capacitive load loaded to the output terminal can be reduced. However, in the conventional configuration, it is difficult to obtain a desired shift time. To obtain a longer shift time, a number of stage of MOS transistors connected in series for noise reduction (a number of serially connected stages) need to be increased, but then propagation delay time of a signal becomes disadvantageously longer.

Generally in a semiconductor integrated circuit based on the conventional technology, a signal propagation delay time or a noise allowance value for each signal vary from device to device, and there is a need to develop a semiconductor integrated circuit in which the values can be set as desired.

SUMMARY OF THE INVENTION

It is an object of the present invention to provide a semiconductor integrated circuit having an output buffer circuit in which a voltage shift time and a signal propagation delay time can be set as desired.

With the present invention, in a semiconductor integrated circuit, there is provided an input/output control circuit having a signal input terminal, a control terminal, a first output terminal and a second output terminal, and a main driver circuit having a two pair of transistors separated from each other, so that, each transistor pair is turned ON step by step at a predetermined time interval, and hence generation of noise can be suppressed. Furthermore, a delay circuit is inserted in a signal propagation path, it is possible to suppress unnecessary through-current between a power supply potential and ground potential in a main driver circuit. In addition, the delay circuit is shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

With the present invention, in a semiconductor integrated circuit, there is provided a main driver circuit having an inverter and two pair of transistors separated from each other, so that each transistor pair is turned ON step by step at a predetermined time interval, and hence generation of noise can be suppressed. Furthermore, a delay circuit is inserted in a signal propagation path, it is possible to suppress unnecessary through-current between a power supply potential and ground potential in a main driver circuit. In addition, the delay circuit is shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

With the present invention, in a semiconductor integrated circuit, there is provided an input/output control circuit having a signal input terminal, a control terminal, a first output terminal and a second output terminal, and a main driver circuit having three pair of transistors separated from each other, so that, each transistor pair is turned ON step by step at a predetermined time interval, and hence generation of noise can be suppressed. Furthermore, two delay circuits are inserted in a signal propagation path, it is possible to suppress unnecessary through-current between a power supply potential and ground potential in a main driver circuit. In addition, the delay circuits are shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

With the present invention, in a semiconductor integrated circuit, there is provided a main driver circuit having an inverter and three pair of transistors separated from each other, so that each transistor pair is turned ON step by step at a predetermined time interval, and hence generation of noise can be suppressed. Furthermore, two delay circuits are inserted in a signal propagation path, it is possible to suppress unnecessary through-current between a power supply potential and ground potential in a main driver circuit. In addition, the delay circuits are shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

With the present invention, in a semiconductor integrated circuit, there are provided inverters in the path between an input/output control circuit and a one of the pair out of three pairs to transistors of a main driver circuit, so that, each transistor pair is turned ON step by step at a predetermined time interval, and hence generation of noise can be suppressed. Furthermore, two delay circuits are inserted in a signal propagation path, it is possible to suppress unnecessary through-current between a power supply potential and ground potential in a main driver circuit. In addition, the delay circuits are shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

With the present invention, in a semiconductor integrated circuit, two inverters are connected in series with the signal input terminal and output of one of it is connected to one of a transistor of a first pair transistors out of three pairs to transistors of a main driver circuit, so that, each transistor pair is turned ON step by step at a predetermined time interval, and hence generation of noise can be suppressed. Furthermore, two delay circuits are inserted in a signal propagation path, it is possible to suppress unnecessary through-current between a power supply potential and ground potential in a main driver circuit. In addition, the delay circuits are shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole smaller.

Other objects and features of this invention will become clear from the following description with reference to the accompanying drawings.

DESCRIPTION OF THE PREFERRED EMBODIMENTS

Figure 1:
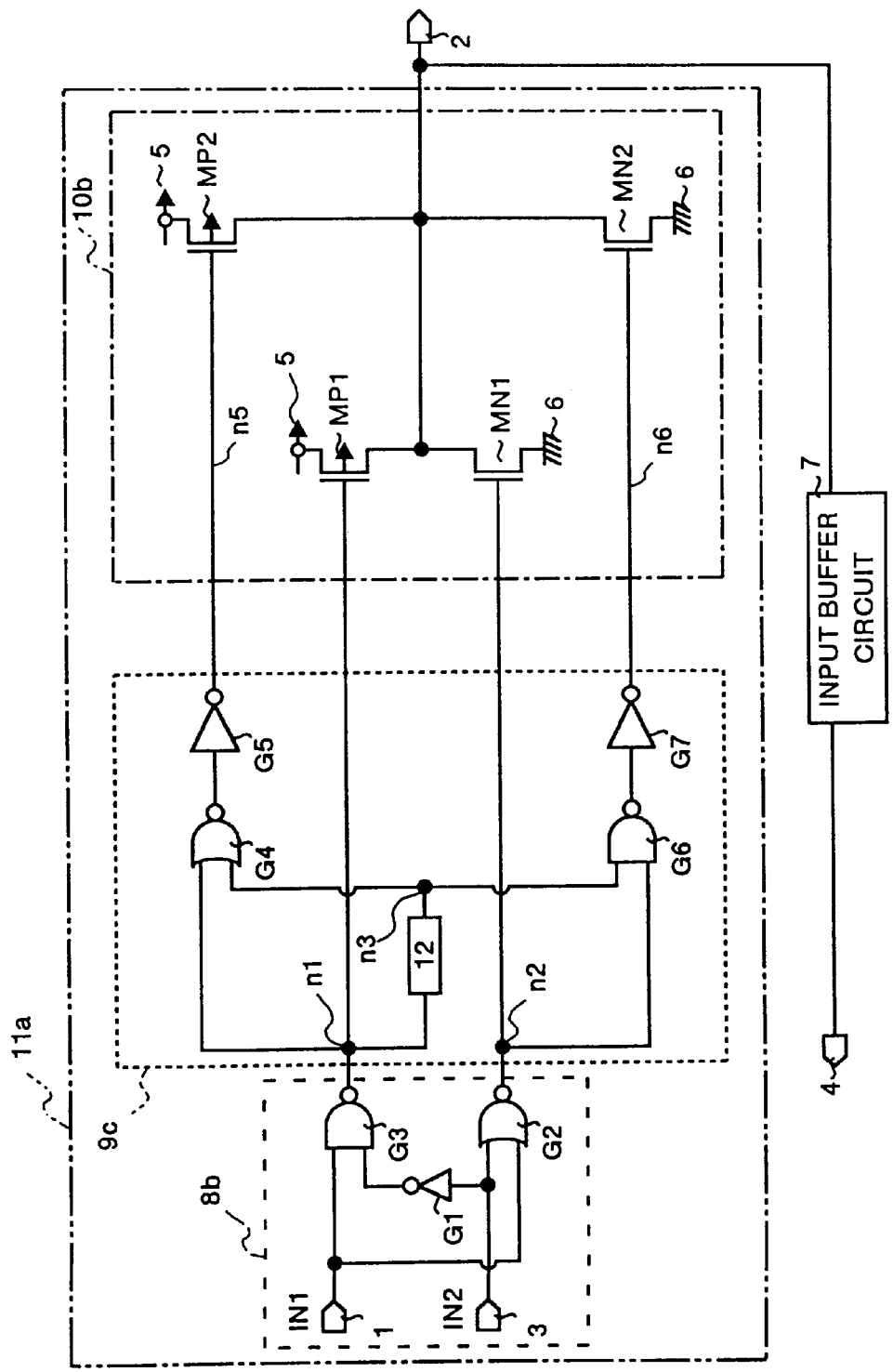
FIG. 1 is a circuit diagram showing configuration of Embodiment 1 of the present invention.

Description is made for Embodiment 1 of the present invention with reference to FIG. 1.

Designated at the reference numeral 1 is a input terminal into which an output signal IN1 is inputted from an internal circuit. 2 is an input/output terminal, 3 is an input/output control terminal receiving an input/output control signal IN2 from the internal circuit, 4 is an output terminal into the internal circuit, 5 is a power supply potential, 6 is a ground potential, 7 is an input buffer circuit, G1, G5, G7 are inverter gates, G2, G4 are two-input NOR gates, G3, G6 are two-input NAND gates, 12 is a delay circuit, MP1 and MP2 are PMOS transistors, MN1 and MN2 are NMOS transistors, and n1, n2, n3, n5, n6 are nodes. Connected to the input/output terminal 2 is the output terminal 4 into the internal circuit via the input buffer circuit 7. In addition, connected to the input/output terminal 2 are the input terminal 1 receiving the output signal IN1 from the internal circuit via a output buffer circuit 11a and the input/output control terminal 3 receiving the input/output control signal IN2 from the internal circuit.

The output buffer circuit 11a comprises an input/output control circuit 8b, a pre-driver circuit 9c, and a main driver circuit 10b.

The input/output control circuit 8b comprises an inverter gate G1 with the input connected to the input/output control terminal 3, a two-input NOR gate G2 with one input terminal thereof connected to the input terminal 1 and other input terminal connected to the input/output control terminal 3, and a two-input NAND gate G3 with one input terminal thereof connected to the input terminal 1 and other input terminal connected to an output terminal of the inverter gate G1.

The pre-driver circuit 9c comprises two-input NOR gate G4, a two-input NAND gate G6, inverter gates G5, G7 and a delay circuit 12. Input of the delay circuit 12 is connected to the node n1 which is a first output terminal of the input/output control circuit 8b. A first input terminal of the NOR gate G4 is also connected to the node n1, and a second input terminal thereof is connected to the node n3 which is an output terminal of the delay circuit 12. An input terminal of the inverter gate G5 is connected to an output terminal of said two-input NOR gate G4, and output thereof is connected via the node n5 to the main driver circuit 10b. On the other hand, a first input terminal of the NAND gate G6 is connected to the node n2 which is a second output terminal of the input/output control circuit 8b. Second input terminal of the NAND gate G6 is connected to the node n3. An input terminal of the inverter gate G7 is connected to an output terminal of said two-input NAND gate G6. Output therefrom is connected via the node n6 to the main driver circuit 10b.

The main driver circuit 10b comprises a PMOS transistor MP1 having a source electrode connected to the power supply potential 5, gate electrode connected via the node n1 to the first output terminal of the input/output control circuit 8b and drain electrode connected to the input/output terminal 2; a NMOS transistor MN1 having a source electrode connected to the ground potential 6, gate electrode connected via the node n2 to the second output terminal of the input/output control circuit 8b and drain electrode connected to the input/output terminal 2; a PMOS transistor MP2 having a source electrode connected to the power supply potential 5, gate electrode connected via the node n5 to the output terminal of inverter gate G5 wherein said the pre-driver circuit 9c and drain electrode connected to the input/output terminal 2; and a NMOS transistor MN2 having a source electrode connected to the ground potential 6, gate electrode connected via the node n6 to the output terminal of inverter gate G7 wherein said the pre-driver circuit 9c and drain electrode connected to the input/output terminal 2.

Hereafter operations of the output buffer circuit 11a having the configuration as described above.

When the input/output control signal IN2 is at "H" level, the output terminals n1 of the input/output control circuit 8b is at "H" level (power supply potential) and the output terminal n2 thereof is at "L" level (ground potential) regardless of whether the output signal IN1 is at "L" lever or at "H" level. "H" level is applied to a gate electrode of the PMOS transistor MP1 of the main driver circuit. 10b which is directly connected to the output terminal n1 and "L" level is applied to a gate electrode of the NMOS transistor MN1 which is directly connected to the output terminal n2, and both of the transistors are turned OFF. Also "H" level is applied to a first input terminal of the NOR gate G4 of the pre-driver circuit 9c, while "H" level signal at the same logical level but delayed by time T1 is inputted via the delay circuit 12 to the second input terminal thereof with the output from the NOR gate G4 turned to "L" level. As a result, "H" level signal is inputted via the inverter gate G5 to a gate electrode of the PMOS transistor MP2 in the main driver circuit 10b when the PMOS transistor MP2 is turned OFF.

On the other hand, "L" level is inputted into a first input terminal (node n2) of the NAND gate G6 and "H" level is inputted via the delay circuit 12 to its second input terminal. As a result, output from the NAND gate G6 is "H", level while "L" level is inputted via the inverter gate G7 into a gate of the NMOS transistor MN2 when the NMOS transistor MN2 turned OFF. Because, all the MOS transistors in the main driver circuit 10b are turned OFF, and the input/output terminal 2 goes into a high impedance state when viewed from an external circuit.

Logical operations of each section when the input/output control signal IN2 is at "L" level are described.

At first, when "H" level is inputted into the input terminal 1, each output from the input/output control circuit 8b is "L" level at both the nodes n1 and n2. As a result, the PMOS transistor MP1 in the first stage of the main driver circuit 10b with the gate electrode directly connected to the node n1 is turned ON and the NMOS transistor MN1 with the gate electrode directly connected to the node n2 are turned OFF. In the second stage, signal at the node n5 with a gate electrode of the PMOS transistor MP2 becomes "L" after a delay time T1 due to the delay circuit 12. For this reason, the PMOS transistor MP2 is turned ON with a time delay of T1. On the other hand, the node n6 with gate electrode of the NMOS transistor MN2 connected thereto becomes "L" via the NAND gate G6 and inverter gate G7. Therefore, the NMOS transistor MN2 is turned OFF. As a result, "H" level is outputted to the input/output terminal 2.

When "L" level is next time inputted into the input terminal 1, output from the input/output control 8b becomes "H" at both the output terminals n1 and n2. As a result, the PMOS transistor MP1 in the first stage of the main driver circuit 10b with the gate electrode directly connected to the node n1 is turned OFF and the NMOS transistor MN1 with the gate electrode directly connected to the none n2 is turned ON. In the second stage, signal at the node n6 with a gate electrode of the NMOS transistor MN2 connected thereto becomes "H" after a delay time T1 due to the delay circuit 12. So the NMOS transistor MN2 is turned ON. On the other hand, the node n5 with a gate electrode of the PMOS transistor MP2 connected thereto becomes "H" via the NOR gate G4 and inverter gate G5. So the PMOS transistor MP2 is turned OFF. As a result, "L" level is outputted to the input/output terminal 2.

As described above. in Embodiment 1 of the present invention, a pair of transistors in the main driver circuit 10b is separated from each other, and each transistor pair is turned ON step by step at a certain time interval, so that generation of noise can be suppressed eased on the principle described below. In addition, simultaneously when any one of the pair of transistors (MP1, MN1) in the first stage is turned ON, the other conductor type of transistors are turned OFF all at once, and an unnecessary through-current between a power supply (VDD) and ground (GND) can be suppressed.

Description is made for noise generally induced into a power supply and ground.

It is known that a relation between electric charge Q, voltage V, and capacitance C can be expressed by the equation (1).

$$i = dQ/dt = C \times dV/dt \quad (1)$$

This expression indicates that i becomes maximum when a voltage change dV/dt becomes maximum. It is known that, dV/dt becomes maximum during shift of output, and at the same time transitional current becomes maximum.

Figure 2:
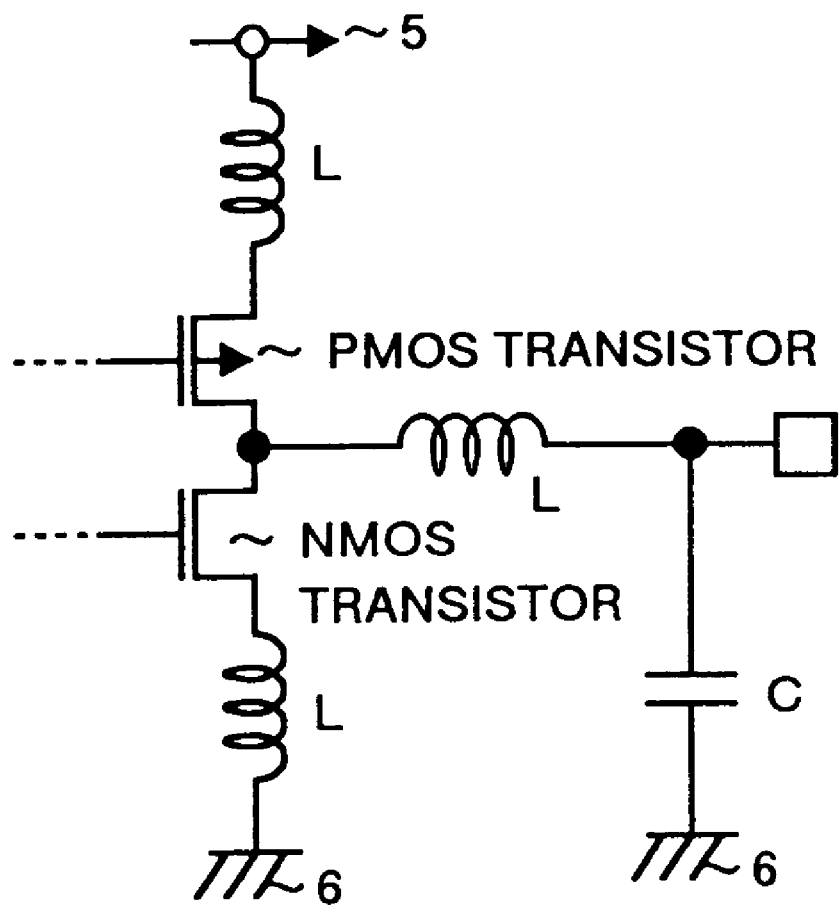
FIG. 2 is an equivalent circuit diagram showing a final stage of an output driver.
Figure 3A:
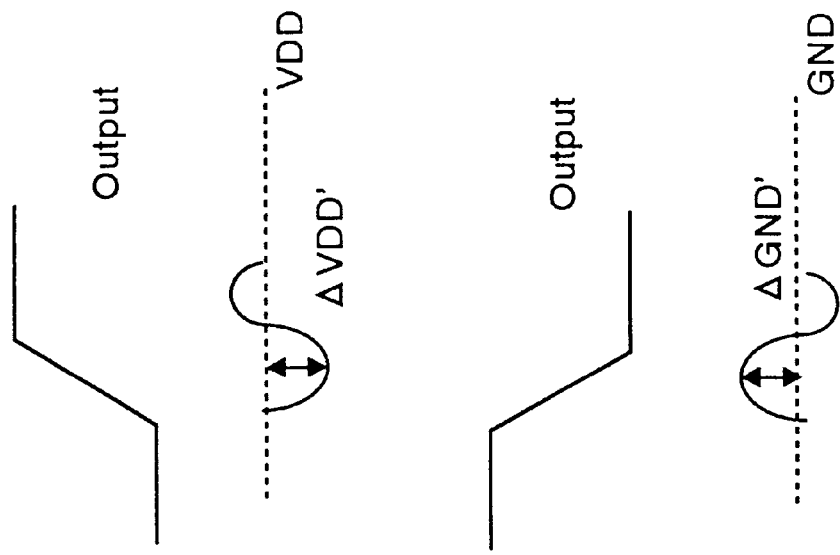
FIGS. 3A and 3B are conceptual views showing noise in a power supply potential and ground potential in this invention and in the prior art.
Figure 3B:
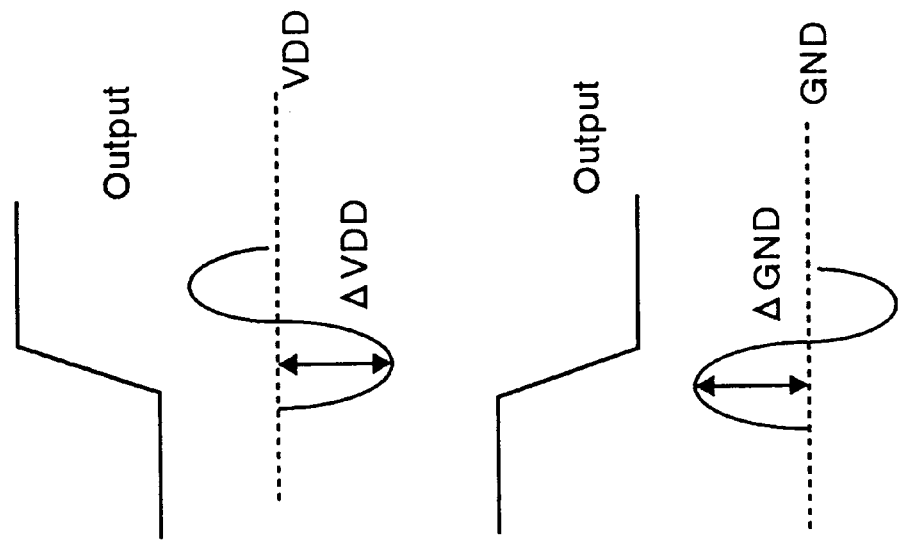

A general equivalent circuit in the final output stage is shown in FIG. 2, and a state of induced voltage generated therein is shown in FIGS. 3A and 3B. Formed at each terminal of an IC is an inductance L due to a package lead or a bonding wire as shown in FIG. 2. The transitional current during shift of output from an IC flows via the terminals each including the inductance L to the power supply unit 5 and the ground 6, and an induced voltage is generated. Herein assuming that i indicates the transitional current and VI indicates an induced voltage, the relation between i and VI is expressed by the equation (2) below:

$$VI = -L \times di/dt \quad (2)$$

From the equations (1) and (2), the following equation is obtained:

$$VI = -LCd2V/dt2 \quad (3)$$

Accordingly, it can be understood that, to suppress the effect by noise by reducing the amplitude of this induced voltage VI, it is necessary to reduce the dV/dt.

In the two transistor pairs in the main driver circuit 10*b*, assuming that a value β (=Weff/Leff×Cox×μ, Weff; Effective gate width, Leff; Effective gate length, Cox; gate-oxide capacitance, μ; mobility of a carrier) in the MOS transistor in each transistor pair is β1, β2, or specifically β in a case when not divided, namely in a case of the main driver circuit 10*a* shown FIG. 15, β>β1, β2. Therefore, a driving capability for a load capacity is smaller in a MOS transistor in each transistor pair as compared to that in the conventional type of MOS transistor, in other words, ON resistance of the transistor is larger, so that the RC time constant becomes larger and also the output shift time becomes longer. Thus, it is possible to make dV/dt smaller, and also it is possible to make the induced voltage V1 expressed by the above equation (3) smaller. Assuming that induced voltages generated in two transistor pairs in the main driver circuit 10*b* shown in FIG. 1 are VI1 and VI2, VI is larger than VI1, VI2, (VI>VI1, VI2). Further VI1 and VI2 are not generated simultaneously but are generated at a certain time interval, peak values of the noise voltage are dispersed and the amplitude is smaller, so that effect of noise is smaller as compared to the conventional technology.

FIGS. 3A and 3B are views for explaining the effects of the present invention FIG. 3A shows noise (ΔVDD, ΔGND) due to induced voltages generated in the power supply (VDD) and ground (GND) in the general output buffer circuit shown in FIG. 2. FIG. 3B shows reduced noise (ΔVDD', ΔGND') due to induced voltages because of configuration according to the present invention.

As described above, it is possible to obtain a semiconductor integrated circuit comprising an output buffer circuit in which a shift time of an output voltage and a signal propagation delay time can be set as desired by arbitrarily setting such parameters as a number of transistor pairs in a main driver circuit and a time delay value in the delay circuit 12.

By inserting a delay circuit in a signal propagation path, it is possible to suppress unnecessary through-current between a power supply potential and ground potential in a main driver circuit in a better way. In addition, the delay circuit is shared by PMOS and NMOS transistors in the main driver circuit, so that it is possible to built an output buffer circuit with fewer transistors. Furthermore, by forming a delay circuit in an internal circuit area of a transistor for internal circuit formation, it is possible to make an area occupied by an output buffer circuit smaller, and to make size of an LSI chip as a whole further smaller.

Figure 4:
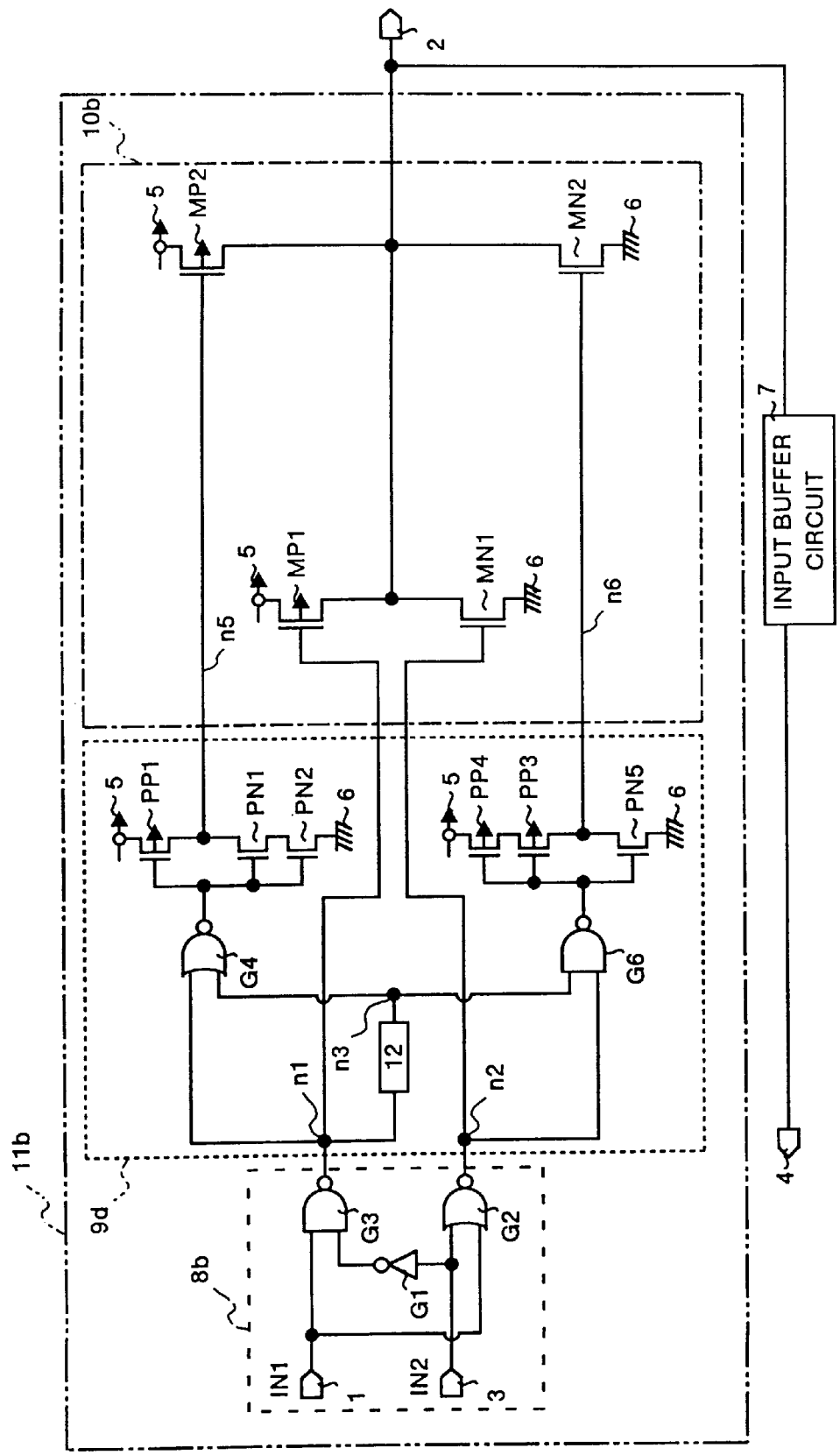
FIG. 4 is a circuit diagram showing configuration in Embodiment 2 of the present invention.

Description is made for Embodiment 2 of the present invention with reference to FIG. 4.

Figure 15:
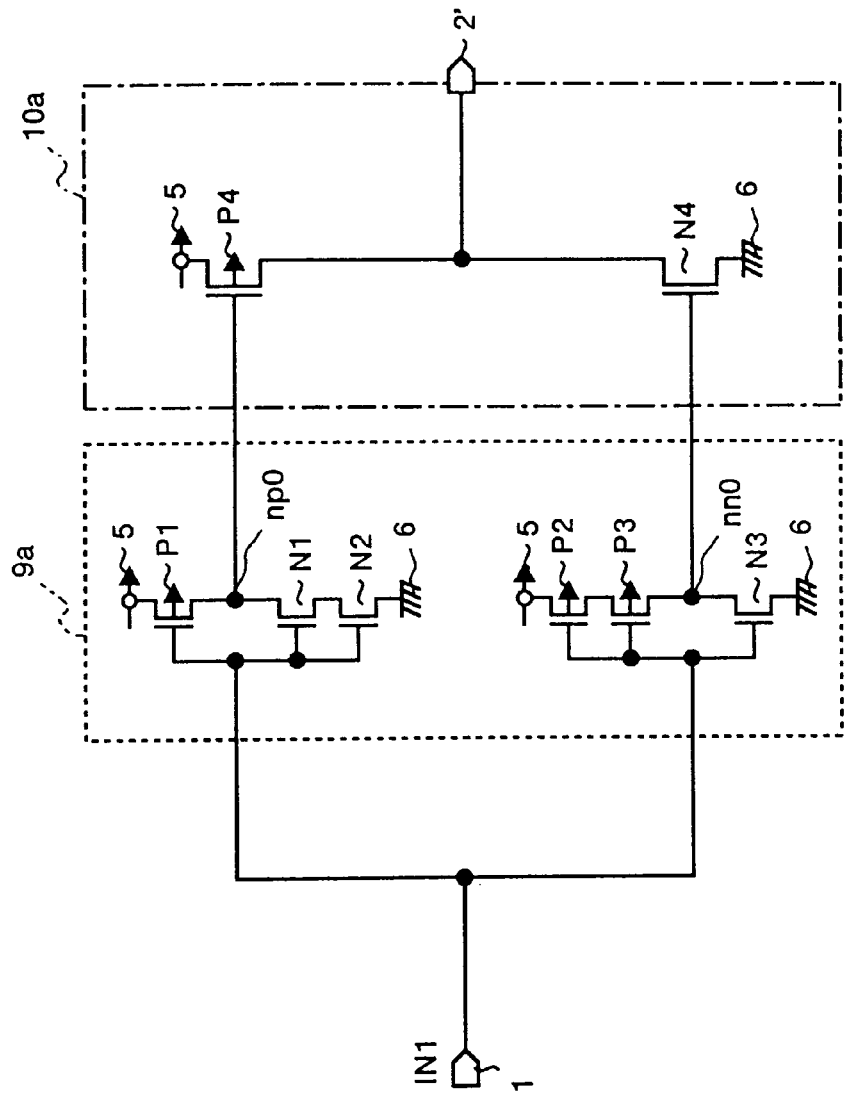
FIG. 15 is a circuit diagram showing configuration of a semiconductor integrated circuit in Example 1 of the conventional technology.
Figure 16:
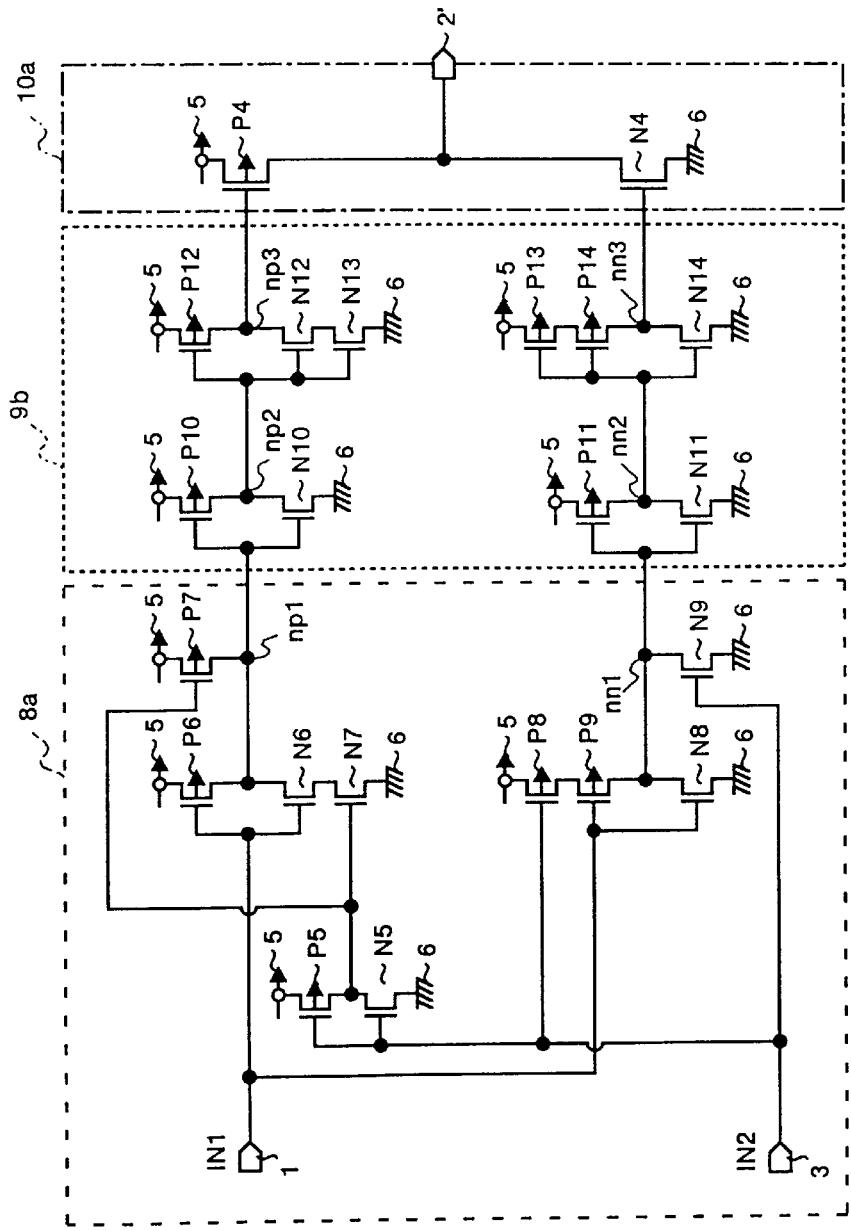
FIG. 16 is a circuit diagram showing configuration of a semiconductor integrated circuit in Example 2 of the conventional technology.
Figure 17A:
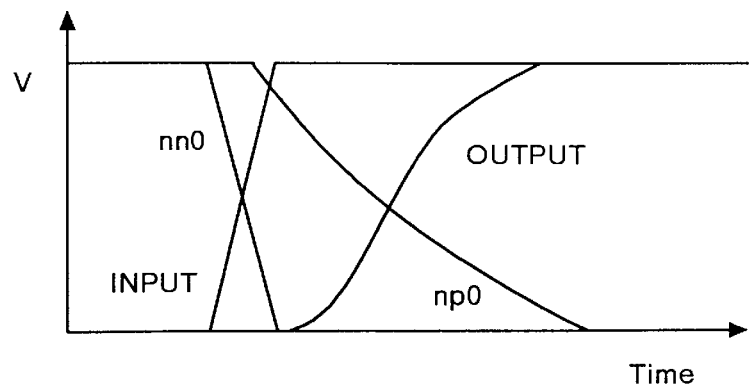
FIGS. 17A and 17B are conceptual views showing noise in a power supply potential and a ground potential in the present invention and in an example of the conventional technology.
Figure 17B:
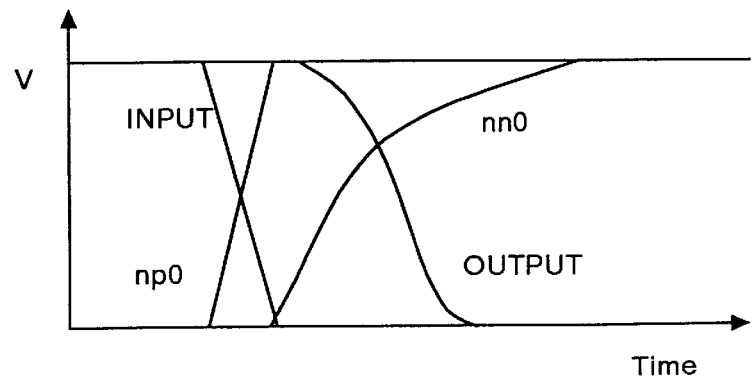

The different between FIG. 1 and FIG. 4 is that, the inverter gate G5 and G7 in FIG. 1 are replaced with inverters each having MOS transistors for noise reduction in the pre-driver circuit 9*a* based on the conventional configuration in FIG. 15.

In detail, an inverter comprising a PMOS transistor PP1 and NMOS transistors PN1 and PN2 replaces the inverter gate G5 and inverter comprising PMOS transistors PP3, PP4 and NMOS transistor PN5 replaces the inverter gate G7 of FIG. 1. The inverter that replaces gate G5 comprises a source electrode connected to the power supply potential 5, gate electrode connected to an output terminal of the NOR gate G4 and drain electrode connected to the node n5; a NMOS transistor PN2 having a source electrode connected to the ground potential 6 and a gate electrode connected to an output terminal of the NOR gate G4; and a NMOS transistor PN1 having a source electrode connected to the drain electrode of the NMOS transistor PN2, gate electrode connected to an output terminal of the NOR gate G4 and a drain electrode connected to the node n5. The inverter that replaces the gate G7 of FIG. 1 comprises a PMOS transistor PP4 having a source electrode connected to the power supply potential 5 and gate electrode connected to an output terminal of the NAND gate G6; a PMOS transistor PP3 having a source electrode connected to a drain electrode of the PMOS transistor PP4, gate electrode connected to an output terminal of the NAND gate G6, and a drain electrode connected to the node n6; and a NMOS transistor PN5 having a source electrode connected to the ground potential 6, gate electrode connected to an output terminal of the NAND gate G6 and drain electrode connected to the node n6.

Logical operations of the output buffer circuit 11*b* having the configuration as shown in FIG. 4 are the same as those in Embodiment 1 as shown in FIG. 1, but signal delay is effected in the pre-driver circuit 9*d*, so that it is possible to obtain a semiconductor integrated circuit having an output buffer circuit in which an output voltage shift time and a signal propagation delay time can be set more freely as compared to Embodiment 1.

Figure 5:
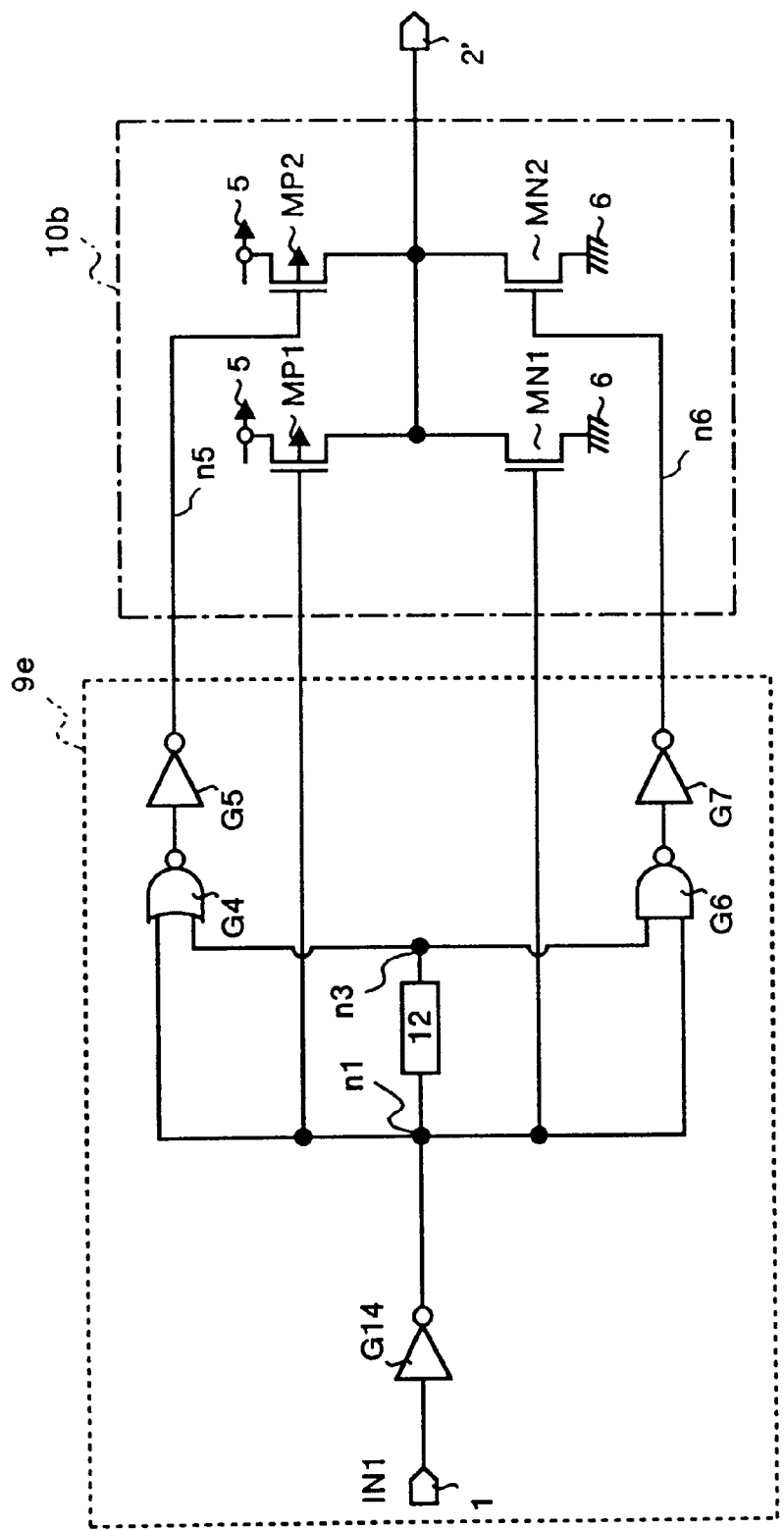
FIG. 5 is a circuit diagram showing configuration in Embodiment 3 of the present invention.

Description is made for Embodiment 3 of the present invention with reference to FIG. 5.

In FIG. 5, designated at the reference numeral 1 is an input terminal into which the output signal IN1 from an internal circuit is inputted. 2' is an output terminal, 5 is a power supply potential, 6 is a ground potential, G5, G7, G14 are inverter gates, G4 is a two-input NOR gate, G6 is a two-input NAND gate, 12 is a delay circuit, MP1 and MP2 are PMOS transistors, MN1 and MN2 are NMOS transistors and n1, n3, n5, n6 are nodes. The pre-driver circuit 9*e* comprises the two-input NOR gate G4, two-input NAND gate G6, inverter gates G5, G7 and G14, and a delay circuit 12.

An input terminal of the inverter gate G14 is connected to the input terminal 1 into which the output signal IN1 from an internal circuit is inputted, and input to the delay circuit 12 is connected to the (circuit) node n1 which is an output terminal of the inverter gate G14. A first input terminal of the NOR gate G4 is connected to the node n1 which is an output terminal of the inverter gate G14, and a second input terminal is connected to the node n3 which is an output terminal of the delay circuit 12. An input terminal of the inverter gate G5 is connected to an output terminal of the NOR gate G4, and the output is connected via the node n5 to the main driver circuit 10*b*.

A first input terminal of the NAND gate G6 is connected to the node n1 which is an output terminal of the inverter gate G14, and a second input terminal thereof is connected to the node n3 which is an output terminal of the delay circuit 12. An input terminal of the inverter gate G7 is connected to an output terminal of the NAND gate G6, and the output is connected via the node n6 to the main driver circuit 10*b*.

The main driver circuit 10*b* comprises a PMOS transistor MP1 having a source electrode connected to the power supply potential 5, gate electrode connected via the node n1 to an output terminal of the inverter gate G14 and drain electrode connected to the output terminal 2'; a NMOS transistor MN1 having a source electrode connected to the ground potential 6, gate electrode connected via the node n1 to an output terminal of the inverter gate G14, and drain electrode connected to the output terminal 2'; a PMOS transistor MP2 having a source electrode connected to the power supply potential 5, gate electrode connected via the node n5 to an output terminal of the inverter gate G5 of the pre-driver circuit 9e and drain electrode connected to the output terminal 2'; and a NMOS transistor MN2 having a source electrode connected to the ground potential 6, gate electrode connected via the node n6 to an output terminal of the inverter gate G7 of the pre-driver circuit 9e and drain electrode connected to the output terminal 2'.

Next, description is made for operations.

When a "H" level signal is inputted into the input terminal 1, a "L" level signal is inputted to both of the PMOS transistor MP1 and NMOS transistor NM1 in the first stage of the main driver circuit 10b. For this reason, the PMOS transistor MP1 is turned ON and the NMOS transistor MN1 is turned OFF.

As for ON/OFF operations of the PMOS transistor MP2 and NMOS transistor MN2 in the second stage, at first output from the NOR gate G4 changes to "H" after a delay of time T1 caused by the delay circuit 12, and then a "L" level signal is inputted via the next inverter gate G5 to the gate electrode of the PMOS transistor MP2 with the PMOS transistor MP2 turned ON. Also a "L" level signal is inputted into a first input terminal of the NAND gate G6, and "H" is outputted regardless of whether the second input terminal is "L" or "H". Then a "L" level signal is inputted via the inverter gate G7 in the next stage into the gate electrode of the NMOS transistor MN2 with the NMOS transistor MN2 turned OFF. As a result, a "H" level signal is outputted from the output terminal 2'.

When a "L" level signal is inputted into the input terminal 1, a "H" level signal is inputted into any of gate electrodes of the PMOS transistor MP1 and NMOS transistor MN1 in the first stage of the main driver circuit 10b. For this reason, MP1 is turned OFF while the NMOS transistor MN1 is turned ON. As for ON/OFF operations of the PMOS transistor MP2 and NMOS transistor MN2 in the second stage, a "H" level signal is inputted into a first input terminal of the NOR gate G4 with a "L" level signal outputted, and then a "H" level signal is inputted via the inverter gate G5 in the next stage into a gate electrode of the PMOS transistor MP2 with the PMOS transistor MP2 turned OFF. Also a "H" level signal is inputted into a first input terminal of the NAND gate G6 with a "H" level signal inputted via the delay circuit 12 into a second input terminal after a delay of time T1 and also with a "L" signal outputted, and then a "H" level signal is inputted via the inverter gate G7 in the next stage into a gate electrode of the output NMOS transistor MN2. As a result, a "L" level signal is outputted from the output terminal 2'.

As described above, also in Embodiment 3 like in Embodiment 1, by arbitrarily setting a number of transistor pairs in a main driver circuit (through how may stages the circuit is turned ON) or delay time in the delay circuit 12, it is possible to obtain a semiconductor integrated circuit having an output buffer circuit in which an output voltage shift time and a signal propagation delay time can be set as desired. Also by inserting a delay circuit in a signal transfer path, it is possible to further suppress an unnecessary through-current between a power supply potential and a ground potential in the main driver circuit. In addition, the delay circuit is shared by the PMOS transistor and NMOS transistor in the main drive circuit, so that an output buffer circuit can be formed with fewer transistors. Further by forming a delay circuit with a transistor for forming an internal circuit in an area for an internal circuit, an area occupied by the output buffer circuit can be made smaller, which in turn makes it possible to make size of an LSI chip as a whole smaller.

Description is made for Embodiment 4 of the present invention.

Figure 6:
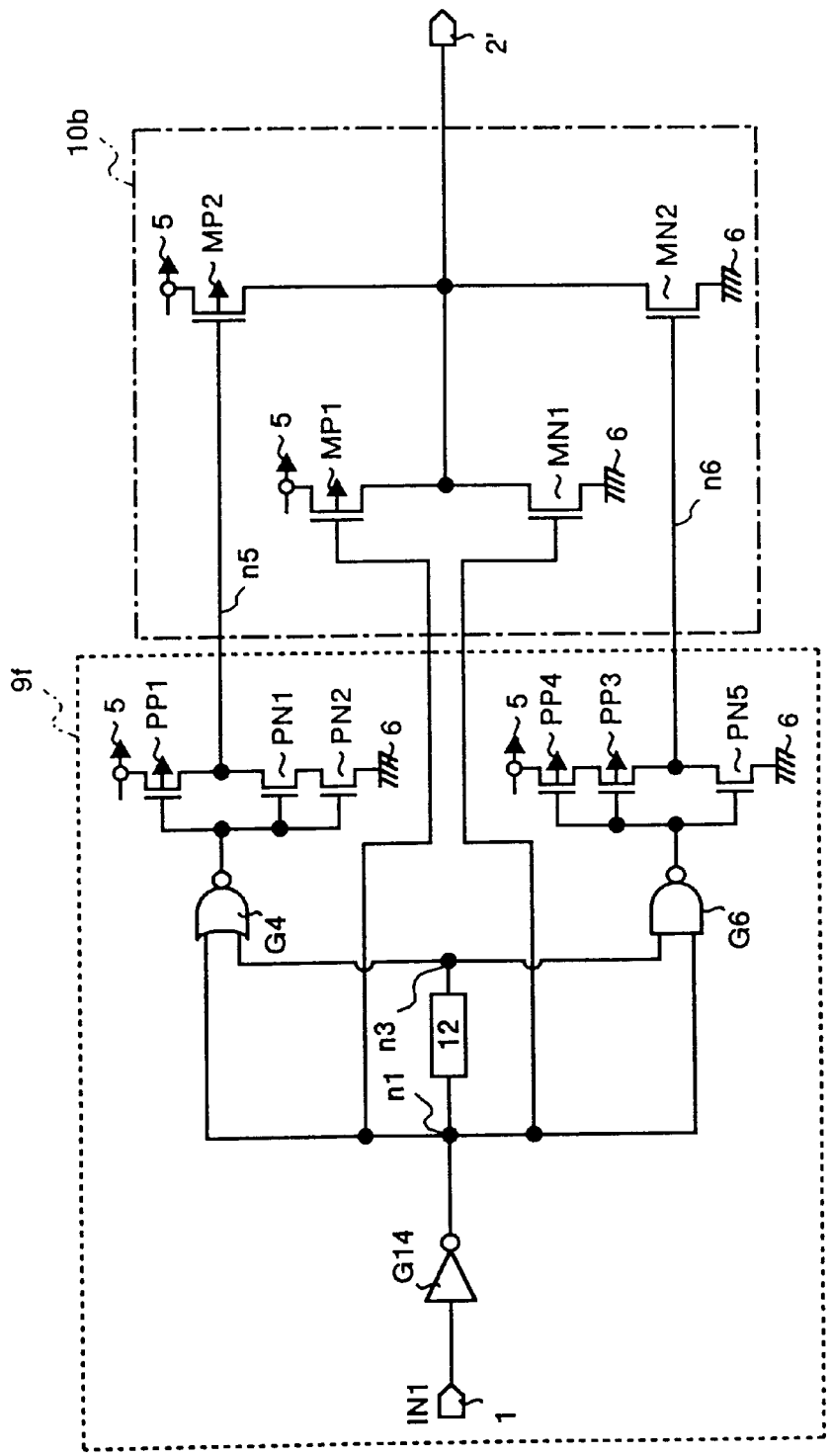
FIG. 6 is a circuit diagram showing configuration in Embodiment 4 of the present invention.

The difference between FIG. 6 and FIG. 5 is that, the inverter gate G5 and inverter gate G7 in FIG. 5 are each replaced by the inverter having a MOS transistors for noise reduction in the pre-driver circuit 9a shown in the conventional configuration of FIG. 15 respectively.

Specifically, an inverter comprising a PMOS transistor PP1 having a source electrode connected to the power supply potential 5, gate electrode connected to an output terminal of the NOR gate G4 and drain electrode connected to the node n5; a NMOS transistor PN2 having a source electrode connected to the ground potential 6 and gate electrode connected to an output terminal of the NOR gate G4; a NMOS transistor PN1 having a source electrode connected to a drain electrode of the NMOS transistor PN2, gate electrode connected to an output terminal of the NOR gate G4 and drain electrode connected to the node n5 replaces the inverter gate G5 of in FIG. 5. A PMOS transistor PP4 having a source electrode connected to the power supply potential 5 and a gate electrode connected to an output terminal of the NAND gate G6; a PMOS transistor PP3 having a source electrode connected to drain electrode of the PMOS transistor PP4, gate electrode connected to an output terminal of the NAND gate G6 and drain electrode connected to the node n6; and a NMOS transistor PN5 having a source electrode connected to the ground potential 6, gate electrode connected to an output terminal of the NAND gate G6 and drain electrode connected to the node n6 replaces the inverter gate C7 of FIG. 5.

Logical operations of he output buffer circuit having the configuration as shown in FIG. 6 are the same as those in Embodiment 3 as shown in FIG. 5, but signal delay is effected in the pre-driver circuit 9f, so that it is possible to obtain a semiconductor integrated circuit having an output buffer circuit in which an output voltage shift time and a signal propagation delay time can be set as desired with increased degree of freedom as compared to Embodiment 3.

Figure 7:
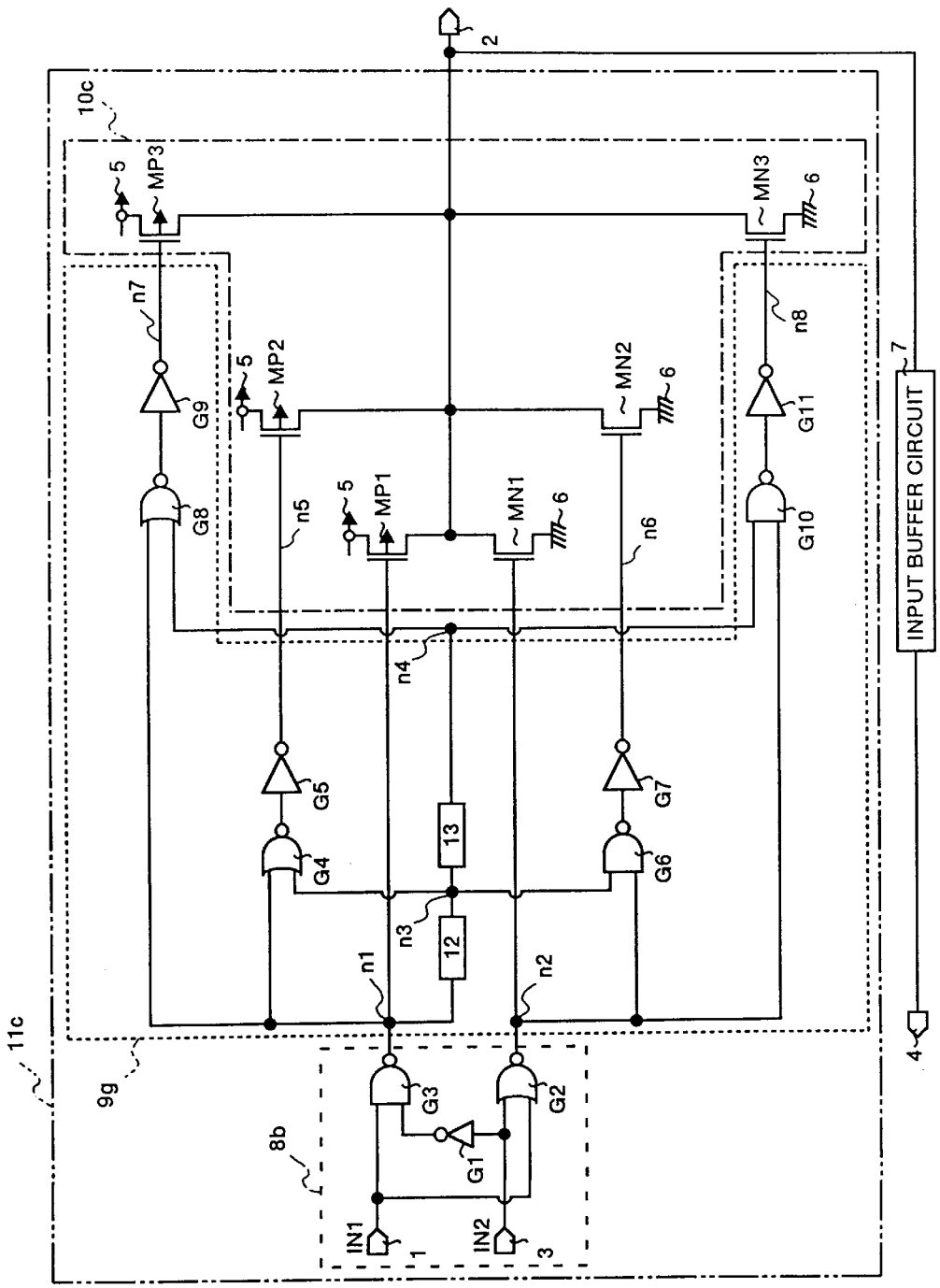
FIG. 7 is a circuit diagram showing configuration in Embodiment 5 of the present invention.

Description is made for Embodiment 5 of the present invention with reference to FIG. 7. In FIG. 7, designated at the reference numeral 1 is an input terminal into which the output signal IN1 from an internal circuit is inputted. 2 is an input/output terminal, 3 is an input/output control terminal for receiving the input/output control signal IN2 from the internal circuit, 4 is an output terminal to an internal circuit, 5 is a power supply potential, 6 is a ground potential, 7 is an input buffer circuit, G1, C5, G7, G9, G11 are inverter gates, G2, G4, G8 are two-input NOR gates, G3, G6, G10 are two-input NAND gates, 12 is a first delay circuit (having a delay value of T1), 13 is a second delay circuit (having a delay value of T2), MP1, MP2, MP3 are PMOS transistors, MN1, MN2, MN3 are NMOS transistors, and n1, n2, n3, n4, n5, n6, n7, n8 are circuit nodes. The output terminal 4 to an internal circuit is connected to the input/output terminal 2 is via the input buffer circuit 7. Also connected to the input/output terminal 2 are the input terminal 1 for receiving the output signal IN1 via the output buffer circuit 11c from the internal circuit and the input/output control terminal 3 for receiving the input/output control signal IN2 from the internal circuit.

The output buffer circuit 11c comprises the input/output control circuit 8b, pre-driver circuit 9g, and main driver circuit 10c.

The input/output control circuit 8b comprises the inverter gate G1 having an input terminal connected to the input/output control terminal 3, the two-input NOR gate G2 with one input terminal thereof connected to the input terminal 1 for receiving the output signal IN1 from an internal circuit and other input terminal connected to the input/output control terminal 3 for receiving the input/output control signal IN2 and the two-input NAND gate G1 with one input thereof connected to the input terminal 1 for receiving the output signal IN1 from an internal circuit and another input terminal connected to an output terminal of the inverter gate G1.

The pre-driver circuit. 9g comprises the two-input NOR gates G4, G8, two-input NAND gates G6, G10, inverter gates G5, G7, G9, G11, first delay circuit 12 and second delay circuit 13. input of the first delay circuit 12 is connected to node n1 which is one of the output terminals of the input/output control circuit 8b, while input of the second delay circuit 13 is connected to an output terminal of the first delay circuit 12 via the node n3. A first input terminal of the NOR gate G4 is connected to the node n1, while the second input terminal is connected to the node n3. An input terminal of the inverter gate G5 is connected to an output terminal of the NOR gate G4 and output thereof is connected via the node n5 to the main driver circuit 10c. A first input terminal of the NOR gate G8 is connected to the node n1, while a second input terminal thereof is connected to the node n4 which is an output terminal of the second delay circuit 13. An input terminal of the inverter gate G9 is connected to an output terminal of the NOR gate G8, and output thereof is connected via the node n7 to the main driver circuit 10c.

First input terminal of the NAND gate G6 is connected to the node n2 which is the other output terminal of the input/output control circuit 8b. A second input terminal thereof is connected to the node n3 which is an output terminal of the first delay circuit 12. An input terminal of the inverter gate G7 is connected to an output terminal of the NAND gate G6 with the output connected via the node n6 to the main river circuit 10c. A first input terminal of the NAND gate G10 is connected to the node n2 and second input terminal thereof is connected to the node n4 which is an output terminal of the second delay circuit 13. An input terminal of the inverter gate G11 is connected to an output terminal of the NAND gate G10 with the output connected via the node n8 to the main river circuit 10c.

In the main driver circuit 10c, each transistor pair is turned ON in three steps successively, and a MOS transistor pair MP1, MN1 is turned ON successively in the first step, a MOS transistor pair MP2, MN2 in the second step, and a MOS transistor pair MP3, MN3 in the third step. The main driver circuit 10c comprises a PMOS transistor MP1 having a source electrode connected to the power supply potential 5, gate electrode connected via the node n1 to a first output terminal of the input/output control circuit 8b and drain electrode connected to the input/output terminal 2; a NMOS transistor MN1 having a source electrode connected to the ground potential 6, gate electrode connected via the node n2 to a second output terminal of the input/output control circuit 8b and drain electrode connected to the input/output terminal 2; a PMOS transistor MP2 having a source electrode connected to the power supply potential 5, gate electrode connected via the node n5 to an output terminal of the inverter gate G5 of the pre-driver circuit 9g and drain electrode connected to the input/output terminal 2; a NMOS transistor MN2 having a source electrode connected to the ground potential 6, gate electrode connected via the node n6 to output terminal of the inverter gate G7 of the pre-driver circuit 9g and drain electrode connected to the input/output terminal 2; a PMOS transistor MP3 having a source electrode connected to the power supply potential 5, gate electrode connected via the node n7 to output terminal of the inverter gate G5 of the pre-driver circuit 9g and drain electrode connected to the input/output terminal 2; and a NMOS transistor MN3 having a source electrode connected to the ground potential 6, gate electrode connected via the node n8 to output terminal of the inverter gate G11 of the pre-driver circuit 9g and drain electrode connected to the input/output terminal 2.

Description is made for operations of the output buffer circuit having the configuration as described above.

If the input/output control signal IN2 is at "H" level, the output terminal n1 of the input/output control circuit 8b becomes "H" (power supply potential), and the output terminal n2 thereof becomes "L" (ground potential) regardless of whether the output signal IN1 is at "L" level or at "H" level. Also "H" level is applied to gate electrode of the PMOS transistor MP1 of the main driver circuit 10c to which the output terminals n1, n2 are directly connected and "L" level is applied to gate electrode of the NMOS transistor MN1 thereof with both of the transistors turned OFF. Also "H" level is applied to a first input terminal of the NOR gate G4 of the pre-driver circuit 9g, while a "H" level signal at the same logical level delayed by time T1 is inputted via the first delay circuit 12 into a second input terminal with output from the NOR gate G4 set in "L" level. As a result, a "H" level signal is inputted into gate electrode of the PMOS transistor MP2 of the main driver circuit 10c via the inverter gate G5 with the PMOS transistor MP2 turned OFF.

On the other hand, a "L" level signal is inputted into a first input terminal (node n2) of the NAND gate G6, and a "H" level signal is inputted via the first delay circuit 12 into a second input terminal. As a result, output from the NAND gate G6 is set in "H" level, and a "L" level is inputted via the inverter gate G7 into a gate of the NMOS transistor MN2 with the NMOS transistor MN2 turned OFF. Also "H" level is applied to a first input terminal of the NOR gate G8 of the pre-driver circuit 9g, and a "H" level signal is inputted via the first delay circuit 12 and the second delay circuit 13 into a second input terminal thereof. As a result, output from the NOR gate G8 becomes "L", while output from the inverter gate G9 becomes "H". For this reason, the PMOS transistor MP3 is turned OFF. A "L" level signal is inputted into a first input terminal of the NAND gate G10, a "H" level is inputted into as second input terminal thereof, output from the NAND gate G10 becomes "H", and output from the inverter gate G11 in the next stage becomes "L" with the NMOS transistor MN3 turned OFF. For this reason, All the MOS transistors constituting the main driver circuit 10c are turned OFF, and the input/output terminal 2 goes into a high impedance state when viewed from an external circuit.

Description is made for logical operations of each section in section when the input/output control signal IN2 is at "L" level.

At first when a "H" level signal is inputted into the input terminal 1, output from the input/output control circuit 8b becomes "L" at both the nodes n1 and n2. As a result, the PMOS transistor MP1 in the first stage of the main driver circuit 10c with the gate electrode directly connected to the output terminals n1, n2 is turned ON, while the NMOS transistor MN1 is turned OFF. In the second stage, the node n5 with a gate electrode of the PMOS transistor MP2 becomes "L" with a time delay T1 caused by the first delay circuit 12. So the PMOS transistor MP2 is turned ON. On the other hand, the node n6 to which the gate electrode of the NMOS transistor MN2 is connected becomes "L" via the NAND gate g6 and inverter gate G7. So the NMOS transistor MN2 is turned OFF. In the third stage, the node n7 to which the gate electrode of the PMOS transistor MP3 is connected becomes "L" with a time delay of T1+T2 caused by the first delay circuit 12 and second delay circuit 13. So the PMOS transistor MP3 is turned ON. On the other hand, the node n8 with the gate electrode of the NMOS transistor MN3 is connected becomes "L" via the NAND gate G10 and inverter gate G11. So the NMOS transistor MN3 is turned OFF. As a result, "H" level is outputted to the input/output terminal 2.

Then, when a "L" level signal is inputted into the input terminal 1, output from the input/output control circuit 8b goes "H" at each of the output terminals n1, n2. As a result, the PMOS transistor MP1 in the first stage of the main driver circuit 10c with the gate electrode directly connected to the output terminals n1, n2 is turned OFF, while the NMOS transistor MN1 is turned ON. In the second stage, the node n6 to which the gate electrode of the NMOS transistor MN2 is connected becomes "H" after a delay of time T1 caused by the first delay circuit 12. So the NMOS transistor MN2 is turned ON. On the other hand, the node n5 to which the gate electrode of the PMOS transistor MP2 is connected becomes "H" via the NOR gate G4 and inverter gate G5. For this reason, the PMOS transistor MP2 is turned OFF. In the third stage, the rode n8 to which the gate electrode of the NMOS transistor MN3 is connected becomes "H" with a sum T1+T2 of a delay time caused by the first delay time 12 and a delay time caused by the second delay time circuit 13. So the NMOS transistor MN3 is turned ON. On the other hand, the node n7 to which the gate electrode of the PMOS transistor MP3 is connected becomes "H" via the NOR gate G8 and inverter gate G9. For this reason, the PMOS transistor MP3 is turned OFF. As a result, an "L" level signal is outputted to the input/output terminal 2.

Figure 14:
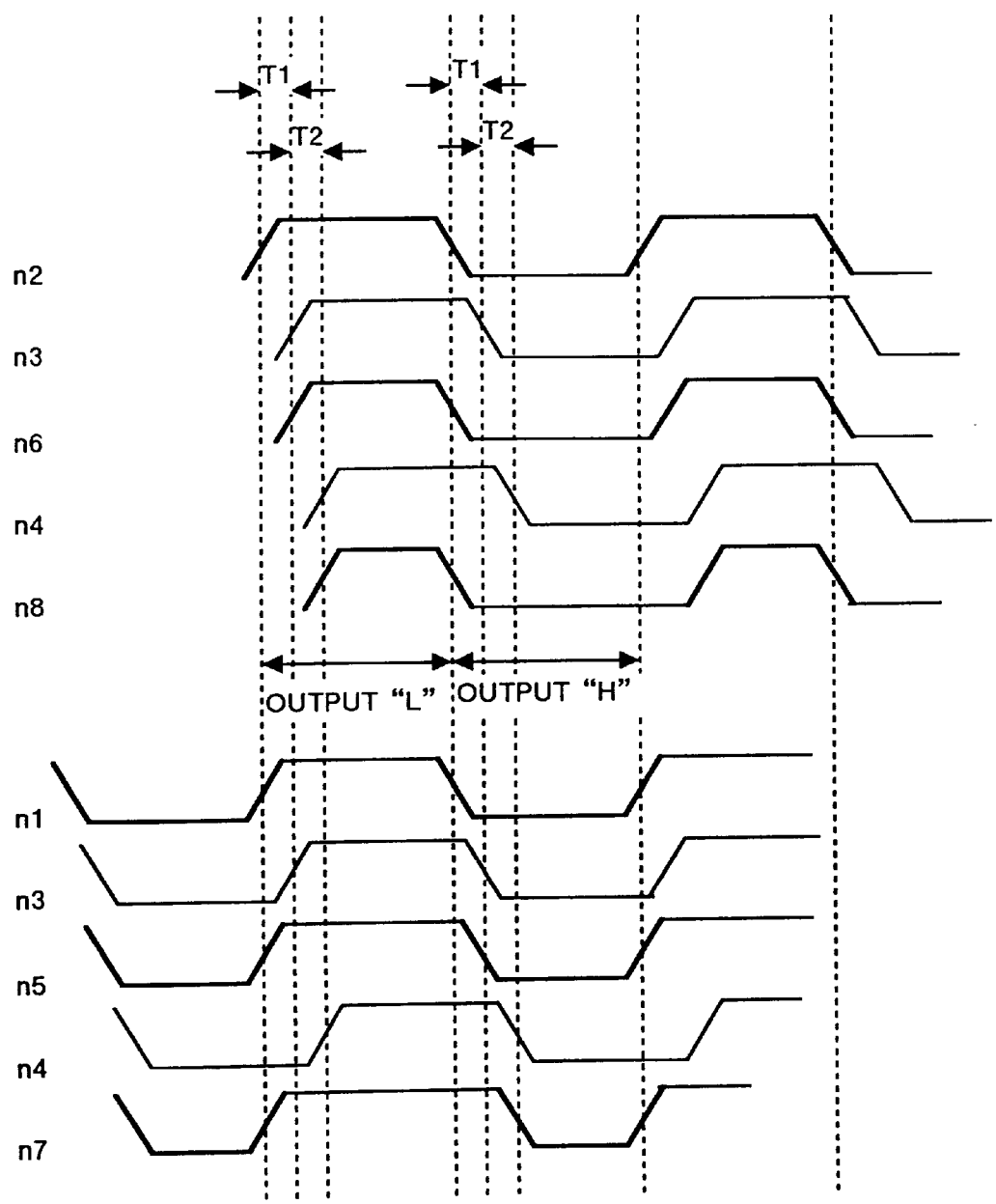
FIG. 14 is a time chart showing operating timing of an output transistor according to the present invention.

The operations described above are shown by timing charts at the nodes n1 to n8 in FIG. 14. It can be seen that the duration of output "L" or "H" at the nodes successive rise or fall.

As described above, also in Embodiment 5 like in Embodiment 1, it is possible to obtain a semiconductor integrated circuit having an output buffer circuit in which an output voltage shift time and a signal propagation delay time can be set by arbitrarily setting a number of transistor pairs in the main driver circuit (through how may stages the should be turned ON) or delay time value in the delay circuit 12. Also by inserting a delay circuit into a signal propagation path, it is possible to more suppress an unnecessary through-current between a power supply potential and a ground potential in a main driver circuit. Also as the delay circuit is shared by PMOS and NMOS transistors in the main driver circuit, it is possible to form an output buffer circuit with fewer transistors. Further, by forming a delay circuit with a transistor for forming an internal circuit in an area for an internal circuit, an area occupied by the output buffer circuit can be made smaller, which makes it possible to make size of an LSI chip as a whole smaller.

Figure 8:
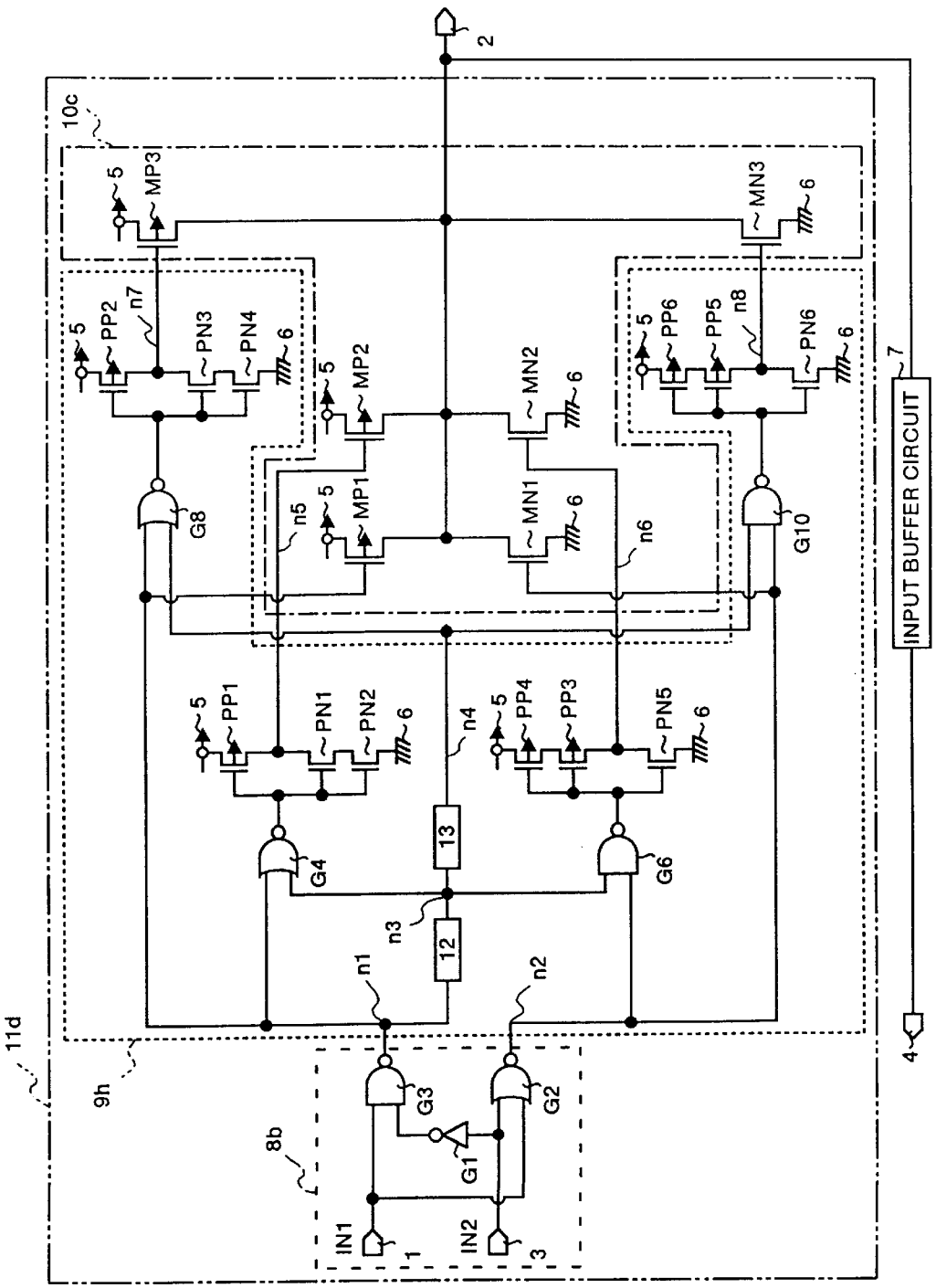
FIG. 8 is a circuit diagram showing configuration in Embodiment 6 of the present invention.

Description is made for Embodiment 6 of the present invention with reference to FIG. 8.

The difference between the FIG. 8 and FIG. 7 is that the inverter gates G5, G7, G9 and G11 in FIG. 7 are each replaced by MOS transistors for noise reduction in the pre-driver circuit 9a shown in the conventional configuration of FIG. 15.

Specifically, an inverter comprising a PMOS inverter PP1 having a source electrode connected to the power supply potential 5, gate electrode connected to an output terminal of the NOR gate G4 and drain electrode connected to the node n5; a NMOS transistor PN2 having a source electrode connected to the ground potential 6 and gate electrode connected to an output terminal of the NOR gate G4; and a NMOS transistor PN1 having a source electrode connected to a drain electrode of the NMOS transistor PN2, gate electrode connected to an output terminal of the NOR gate G4 and drain electrode connected to the node n5 replaces the inverter gate G5 shown in FIG. 7. An inverter comprising a PMOS transistor PP4 having a source electrode connected to the power supply potential 5 and gate electrode connected to an output terminal of the NAND gate G6; a PMOS transistor PP3 having a source electrode connected to a drain electrode of the PMOS transistor PP4, gate electrode connected to an output terminal of the NAND gate G6 and drain electrode connected to the node n6; and a NMOS transistor PN5 having a source electrode connected to the ground potential 6, gate electrode connected to an output terminal of the NAND gate G6 and drain electrode connected to the node n6 replaces the inverter gate G7 shown in FIG. 7. An inverter comprising a PMOS transistor PP2 having a source electrode connected to the power supply potential 5, gate electrode connected to an output terminal of the NOR gate G8 and drain electrode connected to the node n7; and a NMOS transistor PN4 having a source electrode connected to the ground potential 6 and gate electrode connected to an output terminal of the NOR gate G8; and a NMOS transistor PN3 having a source electrode connected to a drain electrode of the NMOS transistor PN4, gate electrode connected to an output terminal of the NOR gate G8 and drain electrode connected to the node n7 replaces the inverter gate G9 in FIG. 7. Finally, an inverter comprising a PMOS transistor PP6 having a source electrode connected to the cower supply potential 5 and gate electrode connected to an output terminal of the NAND gate G10; a PMOS transistor PP5 having a source electrode connected to a drain electrode of the PMOS transistor PP6, gate electrode connected to an output terminal of the NAND gate G10 and drain electrode connected to the node n8; and a NMOS transistor PN6 having a source electrode connected to the ground potential 6, a gate electrode connected to an output terminal of the NAND gate G10 and drain electrode connected to the node n8 replaces the inverter gate G11 in FIG. 7.

Logical operations of the output buffer circuit 11d having the configuration as shown in FIG. 8 are the same as those in Embodiment 5 as shown in FIG. 7, but signal delay is effected in the pre-driver circuit 9d, so that it is possible to obtain a semiconductor integrated circuit having an output buffer circuit in which an output voltage shift time and a signal propagation delay time can be set as desired with increased degree of freedom as compared to Embodiment 5.

Figure 9:
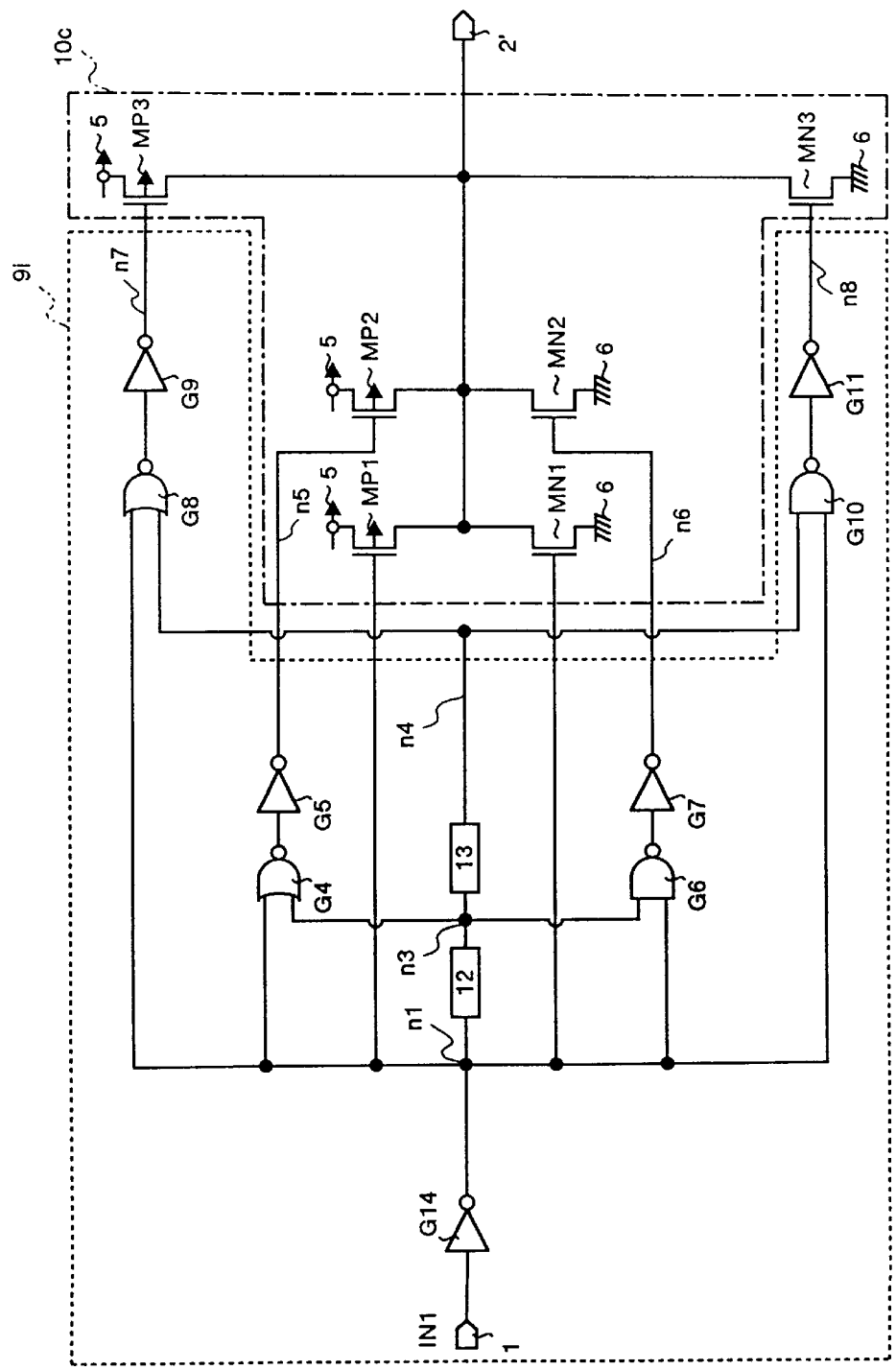
FIG. 9 is a circuit diagram showing configuration in Embodiment 7 of the present invention.

Description is made for Embodiment 7 of the present invention with reference to FIG. 9.

In FIG. 9, designated at the reference numeral 1 is an input terminal into which the output signal IN1 from an internal circuit is inputted. 2' is an output terminal, 5 is a power supply potential, 6 is a ground potential, G5, G7, G9, G11, G14 are inverter gates, G4, G8 are two-input NOR gates, G6, G10 are two-input NAND gates, 12 is a first delay circuit, 13 is a second delay circuit, MP1, MP2 and MP3 are PMOS transistors, MN1, MN2, MN3 are MOS transistors, and n1, n3, n4, n5, n6, n7 and n8 are nodes.

The output buffer circuit shown in FIG. 9 comprises a pre-driver circuit 9i and a main driver circuit 10c. The pre-driver circuit 9*i* comprises the two-input NOR gates G4, G8, two-input NAND gates G6, G10, inverters G5, G7, G9, G11, G14, first delay circuit 12 and ,second delay circuit 13.

Input terminal of the inverter gate G14 is connected to the input terminal 1 into which the output signal IN1 from an internal circuit is inputted. Input terminal of the first delay circuit 12 is connected to the node n1 which is an output terminal of the inverter gate G14 and input terminal of the second delay circuit 13 is connected via the node n3 to an output terminal of the first delay circuit 12. First input terminal of the NOR gate G4 is connected to the node n1, while second input terminal thereof is connected to the node n3. Input terminal of the inverter gate G5 is connected to an output terminal of the NOR gate G4, and the output terminal is connected via the node n5 to the main driver circuit 10*c*.

First input terminal of the NOR gate G8 is connected to the node n1 and second input terminal thereof is connected to the node n4. Input terminal of the inverter gate G9 is connected to an output terminal of the NOR gate G8 and output thereof is connected via the node n7 to the main driver circuit 10*c*. First input terminal of the NAND gate G6 is connected to the node n1 and second input terminal is connected to the node n3. Input terminal of the inverter G7 is connected to an output terminal of the NAND gate G6, and output thereof is connected via the node n6 to the main driver circuit 10*c*. A first input terminal of the NAND gate G10 is connected to node n1 , second input terminal to node n4 and output thereof is connected to inverter G11. The output of inverter G11 is connected via the node n8 to the main driver circuit 10*c*.

The main driver circuit 10*c* comprises a PMOS transistor MP1 having a source electrode connected to the power supply potential 5, gate electrode connected to node n1 and drain electrode connected to the ouput terminal 2'; a NMOS transistor MN1 having a source electrode connected to the ground potential 6, gate electrode connected via the node n1 to output terminal of the inverter gate G14 and drain electrode connected to the output terminal 2'; a PMOS transistor MP2 having a source electrode connected to the power supply potential 5, gate electrode connected via the node n5 to an output terminal of the inverter G5 of the pre-driver circuit 9*i* and drain electrode connected to the output terminal 2'; a NMOS transistor MN2 having a source electrode connected to the ground potential 6, gate electrode connected via the node n6 to an output terminal of the inverter G7 of the pre-driver circuit 9*i* and drain electrode connected to the output terminal 2'; a PMOS transistor MP3 having a source electrode connected to the power supply potential 5, gate electrode connected via the node n7 to an output terminal of the inverter G9 of the pre-driver circuit 9*i* and drain electrode connected to the output terminal 2'; and a NMOS transistor MN3 having a source electrode connected to the ground potential 6, gate electrode connected via the node n8 to an output terminal of the inverter G11 of the pre-driver circuit 9*i* and drain electrode connected to the output terminal 2'.

Description is made for operations of the output buffer circuit shown in FIG. 9.

When a "H" level signal is inputted into the input terminal 1, a "L" level signal is inputted into the PMOS transistor MP1 and NMOS transistor MN1 in the first stage of the main driver circuit 10*c*. So the PMOS transistor MP1 is turned ON and the NMOS transistor MN1 is turned OFF. As for ON/OFF operations of the PMOS transistor MP2 and NMOS transistor MN2 in the second stage, at first output from the NOR gate G4 changes to "H" after a delay of time T1 caused by the first delay circuit 12, and a "L" signal is outputted to a gate electrode of the PMOS transistor MP2 via the next inverter G5. A "L" level signal is inputted into first input terminal of the NAND gate G6, and "H" is outputted to an output terminal thereof regardless of whether the second input terminal is either "L" or "H". Then a "L" level signal is inputted via the inverter G7 in the next stage into a gate electrode of the NMOS transistor MN2 with the NMOS transistor MN2 turned OFF.

As for ON/OFF operations of the PMOS transistor MP3 and NMOS transistor MN3 in the third stage, at first output from the NOR gate G8 changes to "H" with a sum T1+T2 of a time delay in the first delay circuit 12 and a second delay circuit 13, a "L" level signal is inputted into a gate electrode of the PMOS transistor MPP3 via the inverter G9 in the next stage, and the PMOS transistor MP3 is turned ON. A "L" level signal is inputted into a first input terminal of the NAND gate G10 with "H" outputted. Then a "L" level signal is inputted via the inverter G11 in the next stage into a gate electrode of the NMOS transistor MN3 with the NMOS transistor MN3 turned ON. As a result, a "H" level signal is outputted from the output terminal 2'.

When a "L" level signal is inputted into the input terminal 1, a "H" level signal is inputted into the PMOS transistor MP1 and NMOS transistor MN1 in the first stage of the main driver circuit 10*c*. So the PMOS transistor MP1 and NMOS transistor MN1 are turned ON.

As for ON/OFF operations of the PMOS transistor MP2 and NMOS transistor MN2 in the second stage, at first a "H" level signal is inputted into a first input terminal of the NOR gate G4 with a "L" level signal outputted, and a "H" level signal is inputted into a gate electrode of the PMOS transistor MP2 via the inverter G5 in the next stage with the PMOS transistor MP2 turned OFF. A "H" level signal is inputted into a first input terminal of the NAND gate G6, a "H" level signal is inputted into a second input terminal thereof via the first delay circuit 12 with a delay time T1 with a "L" level signal outputted, and a "H" level signal is inputted into a gate electrode of the output NMOS transistor MN2 via the inverter G7 in the next stage with the NMOS transistor MN2 turned ON. As for ON/OFF operations of the PMOS transistor MP3 and NMOS transistor MN3 in the third stage, at first a "H" level signal is inputted into a first input terminal of the NOR gate G8 with an "L" level signal outputted, and a "H" level signal is inputted via the inverter G9 in the next stage into a gate electrode of the PMOS transistor MP3 with the PMOS transistor MP3 turned OFF. A "H" level signal is inputted into a first input terminal of the NAND gate G10, a "H" level signal is inputted into a second input terminal thereof with a sum T1+T2 of a time delay in the first delay circuit 12 and that in the second delay circuit 13 with a "L" level signal outputted, and also a "H" level signal in inputted via the inverter G11 in the next stage into a gate electrode of the NMOS transistor MN3 with the NMOS transistor MN3 turned ON. As a result a "L" level signal is outputted from the output terminal 2'. Description is made for Embodiment 8 of the present invention with reference to FIG. 10.

Figure 10:
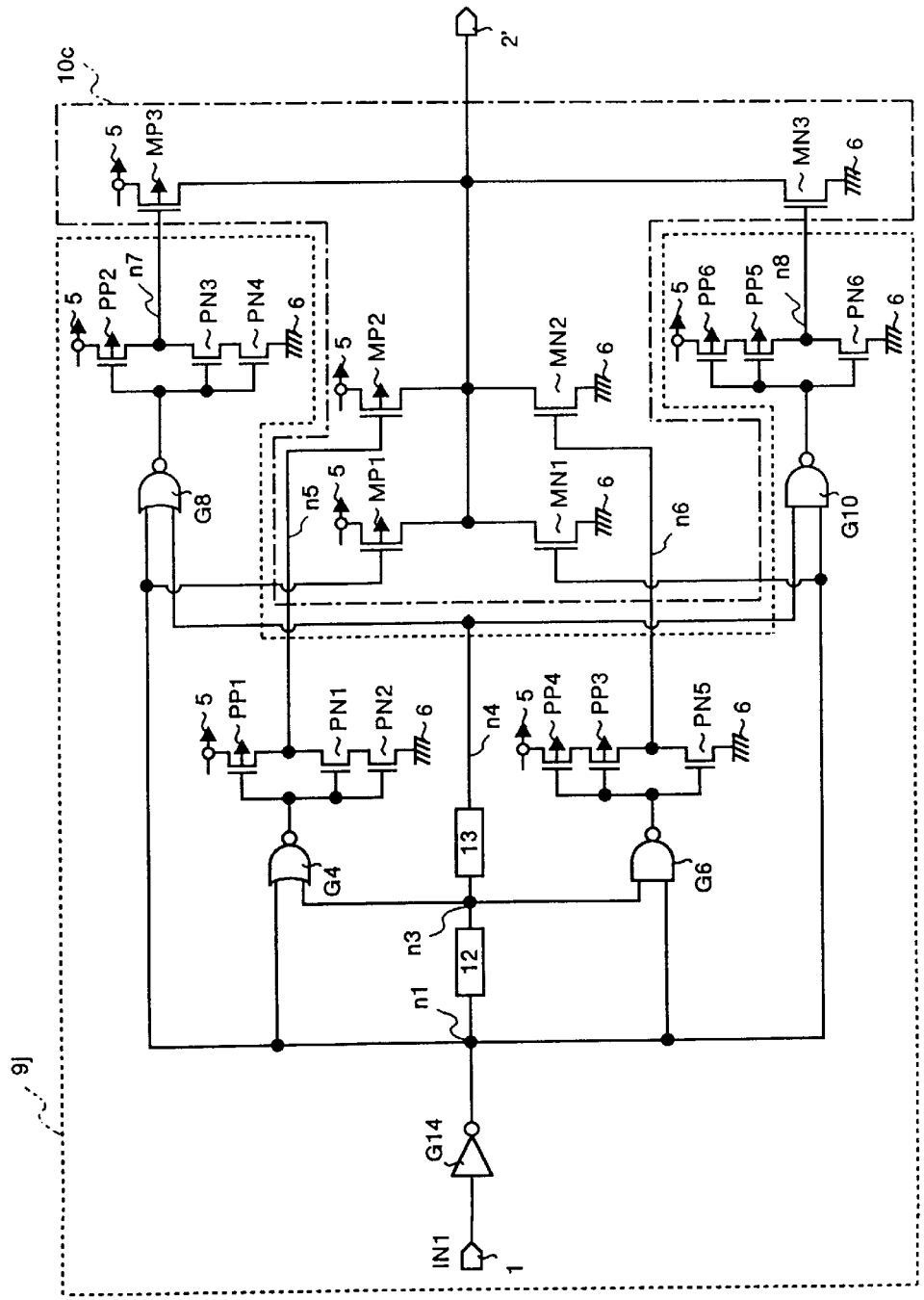
FIG. 10 is a circuit diagram showing configuration in Embodiment 8 of the present invention.

The difference between FIG. 10 and FIG. 9 is that the inverter gates G5, G7, G9 and G11 are each replaced with an inverter having a conventional type of MOS transistor for noise reduction in the pre-driver circuit 9*a* shown in FIG. 14.

Specifically, an inverter comprising a PMOS inverter PP1 having a source electrode connected to the power supply potential 5, gate electrode connected to an output terminal of the NOR gate G4 and drain electrode connected to the node n5; a NMOS transistor PN2 having a source electrode connected to the ground potential 6 and gate electrode connected to an output terminal of the NOR gate G4; and a NMOS transistor PN1 having a source electrode connected to a drain electrode of the NMOS transistor PN2, gate electrode connected to an output terminal of the NOR gate G4 and drain electrode connected to the node n5 replaces the inverter gate G5 shown in FIG. 9. A PMOS transistor PP4 having a source electrode connected to the power supply potential 5 and gate Electrode connected to an output terminal of the NAND gate G6; a PMOS transistor PP3 having a source electrode connected to drain electrode of the PMOS transistor PP4, gate electrode connected to an output terminal of the NAND gate G6 and drain electrode connected to the node n6; and a NMOS transistor PN5 having a source electrode connected to the ground potential 6, gate electrode connected to an output terminal of the NAND gate G6 and drain electrode connected to the node n6 replaces the inverter gate G7 shown in FIG. 9. An inverter comprising a PMOS transistor PP2 having a source electrode connected to the power supply potential 5, gate electrode connected to an output terminal of the NOR gate G8 and drain electrode connected to the node n7; a NMOS transistor PN4 having a source, electrode connected to the ground potential 6 and gate electrode connected to an output terminal of the NOR gate G8; and a NMOS transistor PN3 having a source electrode connected to drain electrode of the NMOS transistor PN4, gate electrode connected to an output terminal of the NOR gate G8 and drain electrode connected to the node n7 replaces the inverter gate G9 shown in FIG. 9. Finally, an inverter comprising a PMOS transistor PP6 having a source electrode connected to the power supply potential 5 and gate electrode connected to an output terminal of the NAND gate G10; a PMOS transistor PP5 having a source electrode connected to drain electrode of the PMOS transistor PP6, gate electrode connected to an output terminal of the NAND gate G10 and drain electrode connected to the node n8; and a NMOS transistor PN6 having a source electrode connected to the ground potential 6, gate electrode connected to an output terminal of the NAND gate G10 and drain electrode connected to the node n8 replaces the inverter gate G11 shown in FIG. 9.

Logical operations of the output buffer circuit having the configuration as described above and shown in FIG. 10 are the same as those in Embodiment 7 shown in FIG. 9, but as signal delay is effected in the pre-driver circuit 9j, it is possible to obtain a semiconductor circuit comprising an output buffer circuit in which an output voltage shift time and a signal propagation delay time can be set as desired with increased degree of freedom as compared to Embodiment 7.

Figure 11:
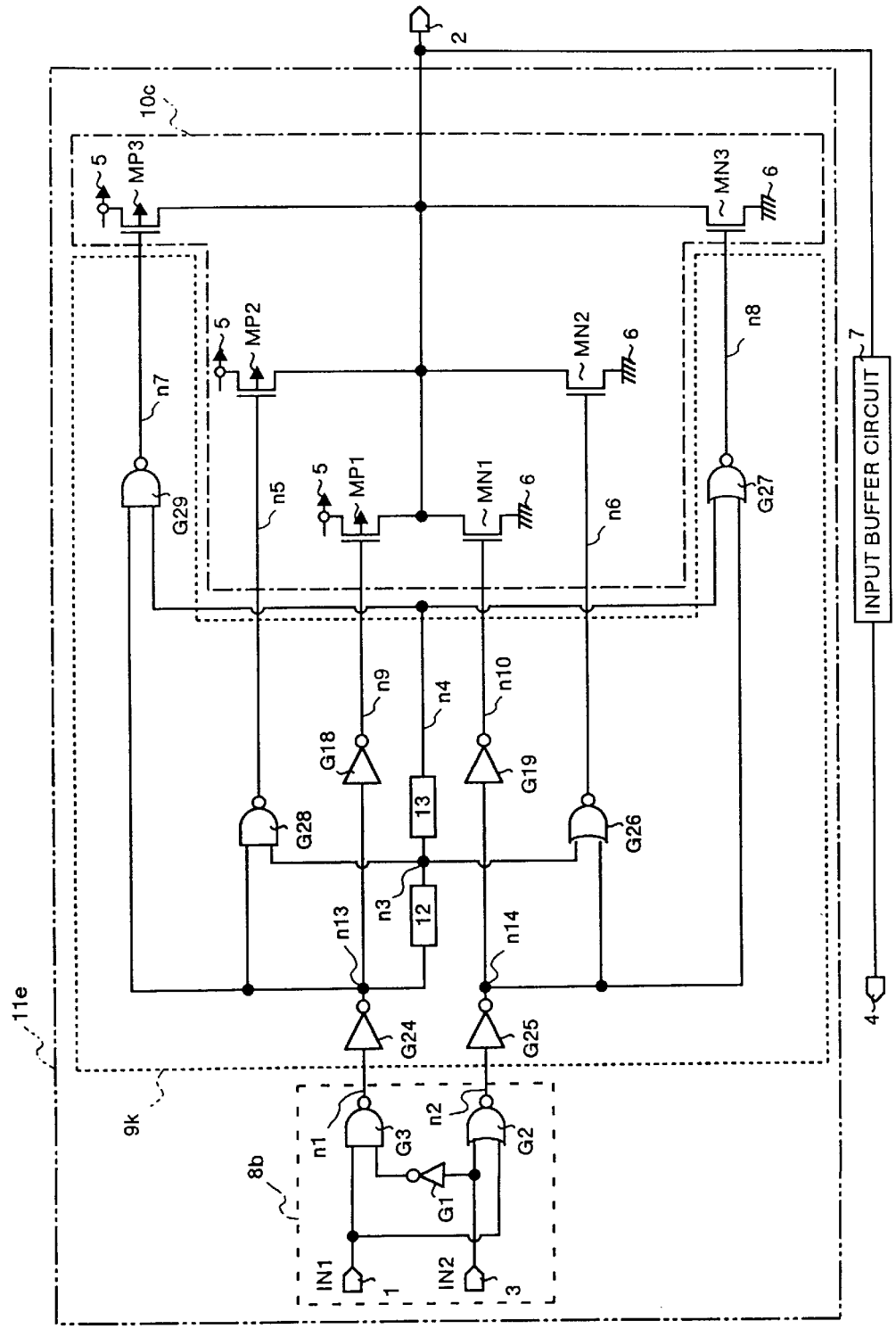
FIG. 11 is a circuit diagram showing configuration in Embodiment 9 of the present invention.

Description is made for Embodiment 9 of the present invention with reference to FIG. 11.

In FIG. 11, designated at the reference numeral 1 is an input terminal into which the output signal IN1 from an internal circuit is inputted. 2 is an input/output terminal, 3 is an input/output control terminal for receiving the input/output control signal IN2 from the internal circuit, 4 is an output terminal to an internal circuit, 5 is a power supply potential, 6 is a ground potential, 7 is an input buffer circuit, G1, G18, G19, G24, G25 are inverter gates, G2, G26, G27 are two-input NOR gates, G3, G28, G29 are two-input NAND gates, 12 is a first delay circuit, 13 is a second delay circuit, MP1, MP2, MP3 are PMOS transistors, MN1, MN2, MN3 are NMOS transistors, n1, n2, n3, n4, n5, n6, n7, n8, n9, n10, n13 and n14 are nodes.

Connected to the input/output terminal 2 is an internal circuit via the input buffer circuit 7. In addition, connected to the input/output terminal 2 are the control terminal 1 for receiving the output signal IN1 via the output buffer 11e from the internal circuit and the input/output control terminal 3 for receiving the input/output control signal IN2 from the internal circuit.

The output buffer circuit 11e comprises an input/output control circuit 8b, a pre-driver circuit 9k and a main driver circuit 10c. Input/output control circuit 8b comprises the inverter gate G1 having an input terminal connected to the input/output control terminal 3; a two-input NOR gate G2 with one input terminal connected to the input terminal 1 for receiving the output signal IN1 from an internal circuit and another input terminal connected to the input/output control terminal 3 for receiving the input/output control signal IN2; and a two-input NAND gate G3 with one input terminal connected to the input terminal 1 for receiving the output signal IN1 from an internal circuit and other input terminal connected to output terminal of the inverter gate G1.

The pre-driver circuit 9k comprises two-input NOR gates G26, G27, two-input NAND gate G28, G29, inverters G18, G19, G24, G25, a first delay circuit 12 and a second delay circuit 13. Input terminal of the inverter G24 is connected to the node n1, and an input terminal of the inverter G25 is connected to the node n2. Input terminal of the first delay circuit 12 is connected to the node n13 which is an output terminal of the inverter G24 and input of the second delay circuit 13 is connected via the node n3 to output terminal of the first delay circuit 12.

A first input terminal of the NOR gate G26 is connected to the node n14 which is an output terminal of the inverter G25, and a second input terminal is connected to the node n3. A first input terminal of the NOR gate G27 is connected to the node n14 and second input terminal is connected to the node n4 which is an output terminal of the second delay circuit 13. A first input terminal of the NAND gate G2E is connected to the node n13 and second input terminal thereof is connected to the node n3. First input terminal of the NAND gate G29 is connected to the node n13 and second input terminal thereof is connected to the node n4.

The main driver circuit 10c comprises a PMOS transistor MP1 having a source electrode connected to the power supply potential 5, gate electrode connected via the node n9 to an output terminal of the inverter G18 of the pre-driver circuit 9k; a NMOS transistor MN1 having a source electrode connected to the ground potential 6, gate electrode connected via the node n6 to output terminal of the inverter G19 of the pre-driver circuit 9k and drain electrode connected to the input/output terminal 2; a PMOS transistor MP2 having a source electrode connected to the power supply potential 5, gate electrode connected via the node n5 to output terminal of the NAND gate G28 of the pre-driver circuit 9k and drain electrode connected to the input/output terminal 2; a NMOS transistor MN2 having a source electrode connected to the ground potential 6, gate electrode connected via the node n6 to output terminal of the NOR gate G26 of the pre-driver circuit 9k and drain electrode connected to the input/output terminal 2; a PMOS transistor MP3 having a source electrode connected to the power supply potential 5, gate electrode connected via the node n7 to output terminal of the NAND gate G29 of the pre-driver circuit 9k and drain electrode connected to the input/output terminal 2; and a NMOS transistor MN3 having a source electrode connected to the ground potential 6, gate electrode connected via the node n8 to an output terminal of the NOR gate G27 of the pre-driver circuit 9k and drain electrode connected to the input/output terminal 2.

Description is made for the operations of the output buffer circuit 11e.

When the input/output control signal IN2 is at "H" level, both the output terminal n1 of the input/output control circuit 8b is at "H" level (power supply potential) and the output terminal n2 thereof is at "L" level (ground potential) regardless of whether the output signal IN1 is at "L" level or at "H" level. As for ON/OFF operations of the MOS transistor in the first stage of the main driver circuit 10c, a "H" level is inputted via the inverters G24, G18 into a gate electrode of the PMOS transistor MP1 and it is turned OFF. A "L" level is inputted to a gate electrode of the NMOS transistor MN1 via the inverters G25, G19 and it is turned OFF.

As for ON/OFF operations of MOS transistors in the second stage of the main driver circuit 10c, a "L" signal is inputted into a first input terminal (node n13), a "L" level signal is inputted to a first input terminal (node n13) of the NAND gate G28, a "L" signal is inputted via the first delay circuit 12 (delay value T1) to a second input terminal (node n3) with a "H" level signal outputted therefrom. As a result, the PMOS transistor MP2 is turned OFF. A "H" level signal is inputted into a first input terminal (node n14) of the NOR gate G26, and a "L" level signal is outputted via the first delay circuit 12 (delay value T1) into a second input terminal thereof (node n3) with a "L" level signal outputted. As a result, the NMOS transistor MN2 is turned OFF.

As for ON/Off operations of MOS transistors in the third stage of the main driver circuit 10c, a "L" level signal is inputted to a first input terminal (node n13) of the NAND gate G29, and a "L" level signal is inputted via the first delay circuit 12 (delay time T1) and second delay circuit 13 (delay time T2) into as second input terminal thereof (node n3) with a "H" level signal outputted therefrom. As a result, the PMOS transistor MP3 is turned OFF. A "H" level signal is inputted into a first input terminal (node n14) of the NOR gate G27, and a "L" level signal is inputted via the first delay circuit 12 (relay value T1) and second delay circuit 13 (delay value T2) into a second input terminal thereof (node n3) with a "L" level signal outputted therefrom. As a result the NMOS transistor MN3 is turned OFF. As a result, all the MOS transistors constituting the main driver circuit 10c are turned OFF, and the input/output terminal 2 goes into a high impedance state when viewed from an external circuit.

Description is made for logical operation in each section when the input/output control signal IN2 is at "L" level.

When a "H" level signal is inputted to the input terminal 1, output from the input/output control circuit 8b becomes "L" at both the output terminals n1, n2. As for ON/OFF operations of MOS transistors in the first stage of the main driver circuit 10c, a "L" level signal is inputted into a gate electrode of the PMOS transistor MP1 via the inverters G24, G18 and the PMOS transistor MP1 is turned ON, while a "L" level signal is inputted via the inverters G25, G19 into a gate electrode of the NMOS transistor MN1.

As for ON/OFF operations of MOS transistors in the second stage of the main driver circuit 10c, at first a "H" level signal is inputted to the first input terminal (node n13) of the NAND gate G28 in the pre-driver circuit 9k, and also a "H" level signal is inputted via the first delay circuit 12 into a second input terminal (node n3) and a "H" level signal is inputted to gate electrode of the PMOS transistor MP2 via the first delay circuit respectively with a "L" level signal outputted from the output terminal (node n5). As a result, the PMOS transistor MP2 is turned ON after a delay of time T1 from the PMOS transistor MP1. Also a "H" level signal is inputted to the first input terminal (node n14) of the NOR gate G26, and a "H" level signal delayed by time T1 is inputted via the first delay circuit 12 into a second input terminal thereof (node n3), but the NOR gate G26 and the NMOS transistor MN1 are turned OFF simultaneously.

As for ON/OFF operations in MOS transistors in the third stage of the main driver circuit 10c, at first a "H" level is inputted into the first input. terminal (node n13) of the NAND gate G29, and a "H" level with a time delay of T1+T2 via the first delay circuit 12 and second delay circuit 13 into the second input terminal (node n4), and as a result a "L" level signal is inputted from the PMOS transistor MP1 to gate electrode of the PMOS transistor MP3 in the main driver circuit 10c with a time delay of T1+T2, and the PMOS transistor MP3 is turned ON. Also, a "H" level signal is inputted to the first input terminal (node n14) of the NOR gate G27, and a "H" level signal is inputted into a second input terminal thereof (node n4) via the first delay circuit 12 and second delay circuit 13 with a time delay of T1+T2, but the NOR gate G27 and NMOS transistor MN1 are turned OFF simultaneously.

When a "H" level signal is inputted into the input terminal 1, a "H" level is outputted to the output terminal 2. When a "L" level signal is inputted into the input terminal 1, output from the input/output control circuit 8b become "H" at both the output terminals n1, n2. As for ON/OFF operations of MOS transistors in the first stage of the main driver circuit 10c, a "H" level signal is inputted via the inverters G24, G18 into a gate electrode of the PMOS transistor MP1 and it is turned OFF, and a "H" level signal is inputted via the inverters G25, G19 into a gate electrode of the NMOS transistor MN1 and it is turned ON.

As for ON/Off operations of MOS transistors in the second stage of the main driver circuit 10c, at first a "L" level signal is inputted into a first input terminal (node n13) of the NAND gate G28 of the pre-driver circuit 9k, and a "L" level signal is inputted into the second input terminal (node n3) via the first delay circuit 12 with a delay time T1 and also a "L" level signal to a gate electrode of the PPMOS transistor MP2 respectively with a "H" level outputted to the output terminal (node n5). As a result, the PMOS transistor MP2 is turned OFF simultaneously with the PMOS transistor MP1. Also a "L" level is inputted to the first input terminal (node n14) of the NOR gate G26, and a "L" level with a delay time T1 is inputted via the first delay circuit 12 into the second input terminal thereof (node n3) and the PMOS transistor is turned ON after a delay time T1 from the NMOS transistor MN1. As for ON/OFF operations of MOS transistors in the third stage of the main driver circuit 10c, at first a "L" level signal is inputted into the first input terminal (node n13) of the NAND gate G29, and a "L" level signal after a delay of time T1+T2 is inputted via the first delay circuit 12 and second delay circuit 13 into the second input terminal (node n4), but a "H" level is inputted into a gate electrode of the PMOS transistor MP3 simultaneously with the PMOS transistor MP1 with the transistor turned OFF. Also a "L" level is inputted into the first input terminal (node n14) of the NOR gate G27 and "L" level after a delay of time T1+T2 is inputted via the first delay circuit 12 and second delay circuit 13 into the second input terminal thereof (node n4), and the NMOS transistor MN3 is turned ON after a delay of time T1+T2 from the NMOS transistor NM1. As a result, when an "L" level input is inputted into -he input terminal 1, a "L" level is outputted from the output terminal 2.

Although an input terminal of the first delay circuit 12 is connected to the node n13 in FIG. 11, the input terminal may be connected to the node n14. As for circuit operations in this case, at first, when input to the input/output control terminal 3 is "L", if a "H" level signal is inputted into the input terminal 1, a "H" level signal is outputted to both the output terminals n1, n2, and if a "L" level is inputted into the input terminal 1, a "L" level signal is outputted to both the output terminals n1, n2. As the same logical level is given to the nodes n13, n14, the same operations as those in FIG. 11 are executed even if input from the first delay circuit 12 is obtained from the node n14.

When input to the input/output control terminal 3 is "H", "H" and "L" level signals are outputted to the output terminals n1, n2 regardless of whether the input terminal 1 is "L" or "H". As a result, ON/OFF operation of MOS transistors in the first stage of the main driver circuit 10c, both the PMOS transistors MP1 and MP2 are turned OFF. As for ON/OFF operations of MOS transistors in the second stage of the main driver circuit 10c, a "L" level signal is inputted to a first input terminal of the NAND gate G28 of the pre-driver circuit 9k in the previous stage, a "L" level signal after a delay of time T1 is inputted also to a second input terminal hereof with a "H" level signal outputted from the NAND gate G28 and the PMOS transistor MP2 turned OFF. Also a "H" level signal is inputted into the first input terminal (node n14) of the NOR gate G26, and a "H" level signal after a delay of time T1 is inputted also to the second input terminal thereof. As a result, output from the NOR gate G26 become "L" with the NMOS transistor MN2 turned OFF. As for ON/OFF operations of MOS transistors in the second stage of the main driver circuit 10c, a "L" level signal is inputted into a first input terminal of the NAND gate G29 of the pre-driver circuit 9k, a "L" level signal after a delay of time T1+T2 is inputted also into as second input terminal thereof with a "H" level signal outputted from he NAND gate G29, and the PMOS transistor MP3 is turned OFF. Also a "H" level signal is inputted into the first input terminal (node n14) of the NOR gate G27, and also a "H" level signal after a delay of time of T1+T2 is inputted also into a second input terminal thereof. As a result, output from the NOR gate G27 becomes "L", and the NMOS transistor MN3 is turned OFF. As a result, all the MOS transistors constituting the main driver circuit 10c are turned OFF, and the input/output terminal 2 goes into a high impedance stage when viewed from an external circuit.

Figure 12:
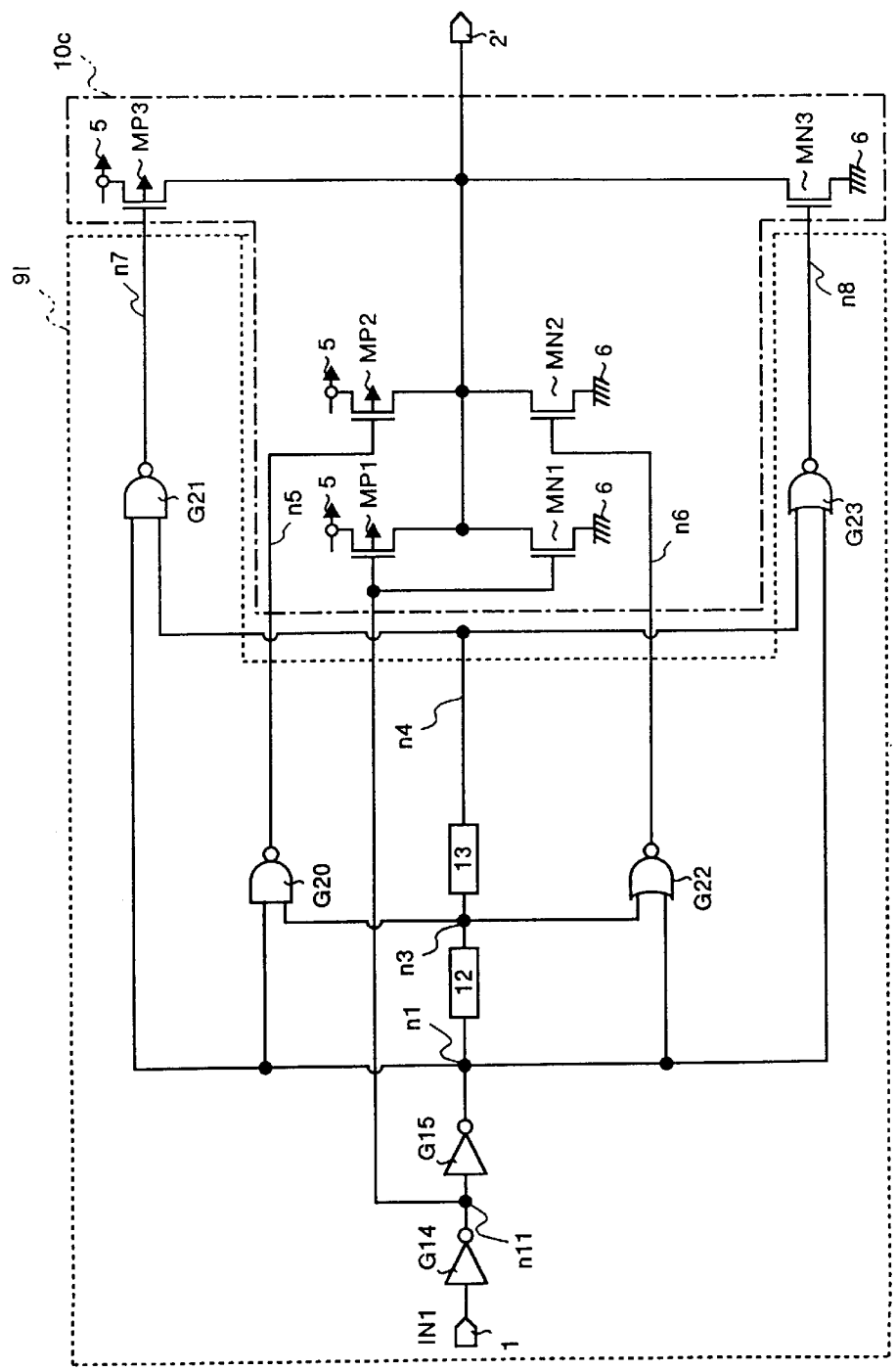
FIG. 12 is a circuit diagram showing configuration in Embodiment 10 of the present invention.

Description is made for Embodiment 10 of the present invention with reference to FIG. 12.

In this embodiment, pre-driver circuit 9i of the Embodiment 7 shown in FIG. 9 is replaced with pre-driver circuit 9l. The output buffer circuit shown in FIG. 12 comprises pre-driver circuit 9l and main driver circuit 10c.

The pre-driver circuit 9l comprises inverters G14, G15, two-input gates G22, G23, two-input NAND gates G20, G21, first delay circuit 12 and second delay circuit 13. An input terminal of the inverter gate G14 is connected to the input terminal 1 into which the output signal IN1 from an internal circuit is inputted. An input terminal of the inverter gate G15 is connected to the output terminal of the inverter gate G14 via node n11. An input terminal of the first delay circuit 12 is connected to the node n1 which is an output terminal of the inverter gate G15 and input terminal of the second delay circuit 13 is connected to an output terminal of the first delay circuit 12 via the node n3. First input terminal of the NOR gate G22 is connected to the node n1, a second input terminal thereof is connected to the node n3 and the output terminal thereof is connected via the node n6 to the main driver circuit 10c in the subsequent stage. On the other hand, a first input terminal of the NOR gate 23 is connected to the node n1 and second input terminal thereof is connected to the node n4 which is an output terminal of the second delay circuit 13 with an output terminal thereof connected via the node n8 to the main driver circuit 10c in the subsequent stage. First input terminal of the NAND gate G20 is connected to the node n1 with output terminal thereof connected via the node n5 to the main driver circuit 10c in the subsequent stage. A first input terminal of the NAND gate G21 is connected to the node n1 and an output terminal thereof is connected via the node n7 to the main driver circuit 10c in the subsequent stage.

The main driver circuit 10c comprises a PMOS transistor MP1 having a source electrode connected to the power supply potential 5, gate electrode (Connected via the node n11 to the output terminal of the inverter gate G14 and drain electrode connected to the output terminal 2'; a NMOS transistor MN1 having a source electrode connected to the ground potential 6, gate electrode connected via the node n11 to an output terminal of the inverter gate G14 and drain electrode connected to the output terminal 2'; a PMOS transistor MP2 having a source electrode connected to the power supply potential 5, gate electrode connected via the node n5 to output terminal of the NAND gate G20 of the pre-driver circuit 9l and drain electrode connected to the output terminal 2'; a NMOS transistor MN2 having a source electrode connected to the ground potential 6, gate electrode connected via the node n6 to output terminal of the NOR gate G22 of the pre-driver circuit 9l and drain electrode connected to the output terminal 2'; a PMOS transistor MP3 having a source electrode connected to the power supply potential 5, gate electrode connected via the node n7 to an output terminal of the NAND gate G21 of the pre-driver circuit 9l and drain electrode connected to the output terminal 2'; a NMOS transistor MN3 having a source electrode connected to the ground potential 6, gate electrode connected via the node n8 to output terminal of the NOR gate G23 of the pre-driver circuit 9l and drain electrode connected to the output terminal 2'.

When a "L" level signal is inputted into the input terminal 1, a "H" level signal is inputted into gate electrodes of the PMOS transistors MP1, MP2 in the first stage of the main driver circuit 10c with the PMOS transistor MP1 turned OFF and NMOS transistor MN1 turned ON. In the second stage, "L" level signal is inputted into the first input terminal (node n1) of the NAND gate G20 of the pre-driver circuit 9l, and a "L" level signal after a delay of time T1 is inputted via the first delay circuit 12 into the second input terminal (node n3) thereof. As a result, the NAND gate G20 outputs a "H" level signal not depending on the delay time T1, and the PMOS transistor MP2 is turned OFF. Also a "L" level signal is inputted into the first input terminal (node n1) of the NOR gate G22, and also a "L" level signal after delay of time T1 caused by the first delay circuit 12 is inputted into the second input terminal (node n3), and as a result a "H" level signal is inputted into a gate electrode of the NMOS transistor MN2. For this reason the NMOS transistor MN2 is turned ON after a delay of time T1 from the NMOS transistor MN1.

Description is made for ON/OFF operations in the third stage. A "L" level signal is inputted into the first input terminal (node n1) of the NAND gate G21, and a "L" signal is inputted via the first delay circuit 12 and second delay circuit 13 into a second input terminal thereof with a time delay of T1+T2, but the NAND gate G2C outputs a "H" level signal not depending on the time delay of T1+T2 with the PMOS transistor MP3 turned OFF. Also a "L" level signal is inputted into the first input terminal (node n1) of the NOR gate G23, a "L" level signal inputted to the second input terminal (node n4) with time delay T1+T2 with a "H" level signal outputted, and the NMOS transistor MN2 is turned on after time delay of T1+T2 from the NMOS transistor MN1. As a result, a "L" level signal is inputted into the input terminal 1, and a "L" level signal is outputted to the output terminal 2'.

Then, as for ON/OFF operations of MOS transistors in the first stage of the main driver circuit 10c when a "H" level signal is inputted into the input terminal 1, a "L" level signal is inputted to gates of both the PMOS transistors MP1 and MP2 with the PMOS transistor MP1 turned ON and NMOS transistor MN1 turned OFF. A "L" level signal is inputted to a gate electrode of the PMOS transistor MP2 in the second stage after time delay T1 from the gate electrode of the PMOS transistor MP1 with the PMOS transistor MP2 turned ON. The NOR gate G24 outputs a "L" level without depending on time delay T1, so that the NMOS transistor MN2 is turned OFF. A "L" level signal is inputted after a time delay of T1+T2 from the PMOS transistor G23, and the PMOS transistor MP3 is turned ON. Since the NOR gate G23 outputs a "L" signal not depending on T1+T2, the NMOS transistor MN3 is turned OFF. As a result, when a "H" level signal is inputted into the input terminal 1, a "H" level signal is outputted to the output terminal 2'.

Figure 13:
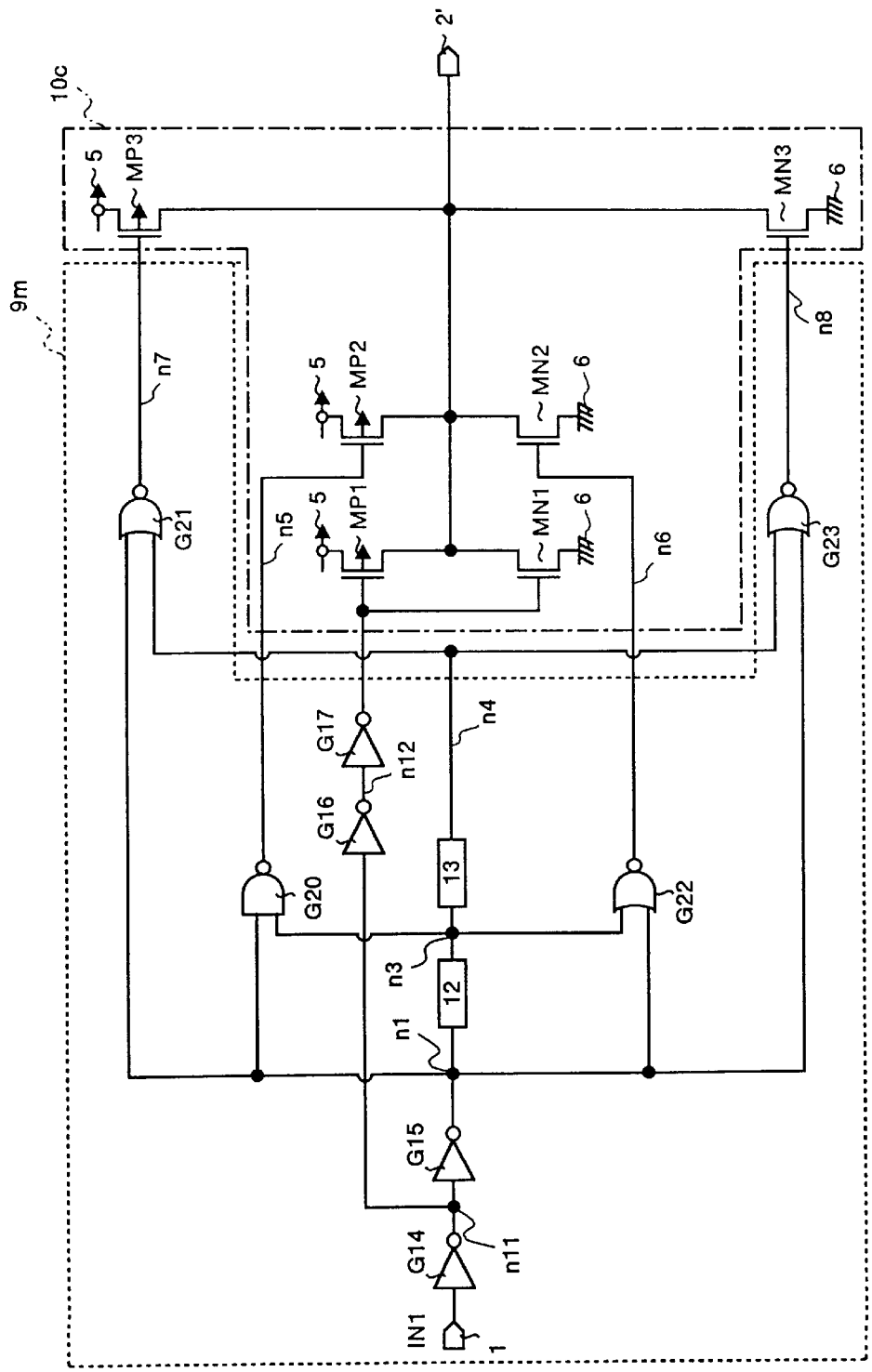
FIG. 13 is a circuit diagram showing configuration in Embodiment 11 of the present invention.

Next description is made for Embodiment 11 of the present invention with reference to FIG. 13.

A circuit according to this embodiment is characterized in that the pre-driver circuit 9*l* of FIG. 12 is replaced with a pre-driver circuit 9m. In the pre-driver circuit 9m, inverters G16 and G17 are inserted between the node n1 and gate electrode of the output PMOS transistor MP1 of FIG. 12.

Description is made fox operations of the output buffer circuit having the configuration described above. The difference between FIG. 13 and FIG. 12 is that, the inverters G16, G17 are inserted between the node n11 and gates of the transistors MP1, MN1, and the logical operations of this circuit are basically the same as those shown in FIG. 12. The inverters G16, G17 are inserted for adjusting timing, and the purpose is to suppress a through-current between power supply and ground in the main driver circuit 10c. There is a difference in a number of elements from the input terminal 1 to each gate between MOS transistor elements in the first stage and those in the second and third stages, and the first stage is turned OFF at the earliest point of time, and then the second and third stages are turned OFF simultaneously. For this reason, sometimes PMOS and NMOS transistors in a main driver circuit may be turned ON simultaneously, and a through-current may flow between power supply and ground, which is disadvantageous. In this embodiment, this problem is solved with the circuit configuration shown in FIG. 13.

As described above, wish the semiconductor integrated circuit according to the present invention, transistors in a main driver circuit are divided to a plurality of groups, and each group is turned ON step by step at a certain time interval, so that noise induced to power supply and ground are dispersed at a certain time interval, namely peak values of a noise voltage are distributed (with a small amplitude), so that the circuit is not affected by noise.

In addition, it is possible to obtain a semiconductor integrated circuit having an output buffer circuit in which an output voltage shift time and a signal propagation delay time can be set as desired.

Delay circuits are inserted into a signal propagation path, so that an unnecessary through-current between power supply potential and ground potential in the main driver circuit can be suppressed appropriately.

Since the delay circuit is shared by a PMOS transistor and an NMOS transistor in the main driver circuit, so that it is possible to design an output buffer circuit with fewer transistors.

Furthermore, by forming a delay circuit with a transistor for forming an internal circuit in an area for the internal circuit, an area occupied by the output buffer circuit can be reduced, which in turn makes it possible to further reduce size of an LSI chip as a whole.

Finally, an output buffer circuit can be set in a high impedance state from a control terminal, so that an input/output buffer circuit can be formed in combination with an input buffer circuit.

This application is based on Japanese patent application No. HEI 10-154540 filed in the Japanese Patent Office on Jun. 3, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:

a semiconductor substrate;

an input/output control circuit formed on the surface of said semiconductor substrate, said input/output control circuit having a signal input terminal, a control terminal, a first output terminal and a second output terminal;

a pre-driver circuit having first and second input terminals, third to sixth output terminals, a delay circuit, a two-input NOR gate, a two-input NAND gate and first and second inverters, in said pre-driver circuit, first and second input terminals are connected to first and second output terminals of said input/output control circuit respectively, first and second input terminals are connected to forth and fifth output terminals, first input terminal is connected to said delay circuit and said two-input NOR gate, second input terminal is connected to said two-input NAND gate, remaining input terminals of said two-input NOR gate and said two-input NAND gates are connected to the output terminal of said delay circuit, output terminal of said two-input NOR gate is connected to said first inverter and output of said first inverter is connected to third output terminal, output terminal of said two-input NAND gate is connected to said second inverter and output of said second inverter is connected to sixth output terminal;

a main driver circuit having third to sixth input terminals and a seventh output terminal, a pair of transistor groups, each of said transistor group comprising a first conductor-type MOS transistor and a second conductor-type MOS transistor, in said main driver circuit, third to sixth input terminals are connected to said third to sixth output terminals of said pre-driver circuit respectively, seventh output terminal is connected to drain electrodes of the MOS transistors of said transistor groups, source electrode of one of the first conductor type MOS transistors is connected to power supply and gate electrode is connected to forth input terminal, source electrode of one of the second conductor type MOS transistors is connected to ground and gate electrode is connected to fifth input terminal, source electrode of remaining first conductor type MOS transistors is connected to power supply and gate electrode is connected to third input terminal, source electrode of remaining second conductor type MOS transistors is connected to ground and gate electrode is connected to sixth input terminal;

a signal output terminal to which seventh output terminal of said main driver circuit is connected.

2. A semiconductor integrated circuit according to claim 1; wherein, said first inverter comprises a first conductor type MOS transistor and at least two second conductor type MOS transistors, in said first inverter, drain electrode of said first conductor type MOS transistor and drain electrode of one of said second conductor type MOS transistors is connected to each other to form an output terminal, source electrodes of said second conductor type MOS transistors are connected to each other, gate electrodes of all of the MOS transistors are connected to form an input terminal;

said second inverter comprises at least two first conductor type MOS transistor and a second conductor type MOS transistors, in said second inverter, drain electrode one of said first conductor type MOS transistor and drain electrode of said second conductor type MOS transistors is connected to each other to form an output terminal, source electrodes of said first conductor type MOS transistors are connected to each other, gate electrodes of all of the MOS transistors are connected to form an input terminal.

3. A semiconductor integrated circuit according to claim 2; wherein, said first inverter comprises a first conductor type MOS transistor and at least two second conductor type MOS transistors, in said first inverter, drain electrode of said first conductor type MOS transistor and drain electrode of one of said second conductor type MOS transistors is connected to each other to form an output terminal, source electrodes of said second conductor type MOS transistors are connected to each other, gate electrodes of all of the MOS transistors are connected to form an input terminal;

said second inverter comprises at least two first conductor type MOS transistor and a second conductor type MOS transistors, in said second inverter, drain electrode one of said first conductor type MOS transistor and drain electrode of said second conductor type MOS transistors is connected to each other to form an output terminal, source electrodes of said first conductor type MOS transistors are connected to each other, gate electrodes of all of the MOS Transistors are connected to form an input terminal.

4. A semiconductor integrated circuit comprising:

a semiconductor substrate;

a pre-driver circuit having signal input terminal, first to fourth output terminals, a delay circuit, a two-input NOR gate, a two-input NAND gate and first to third inverters, in said pre-driver circuit, input terminal of said third inverter is connected to the signal input terminal, output terminal of said third inverter is connected to the input terminal of said delay circuit, output terminal of said third inverter is connected to the second and third output terminals, output terminal of said third inverter is connected to input terminals of said two-input NOR gate and said two-input NAND gate, remaining input terminals of said two-input NOR gate and said two-input NAND gates are connected to the output terminal of said delay circuit, output terminal of said two-input NOR gate is connected to said first inverter and output of said first inverter is connected to first output terminal, output terminal of said two-input NAND gate is connected to said second inverter and output of said second inverter is connected to forth output terminal;

a main driver circuit having first to forth input terminals and a fifth output terminal, a pair of transistor groups, each of said transistor group comprising a first conductor-type MOS transistor and a second conductor-type MOS transistor, in said main driver circuit, first to forth input terminals are connected to said first to forth output terminals of said pre-driver circuit respectively, fifth output terminal is connected to drain electrodes of the MOS transistors of said transistor groups, source electrode of one of the first conductor type of said MOS transistors is connected to power supply and gate electrode is connected to second input terminal, source electrode of one of the second conductor type of said MOS transistors is connected to ground and gate electrode is connected to third input terminal, source electrode of remaining first conductor type of said MOS transistors is connected to power supply and gate electrode is connected to first input terminal, source electrode of remaining second conductor type of said MOS transistors is connected to ground and gate electrode is connected to forth input terminal;

a signal output terminal to which fifth output terminal of said main driver circuit is connected.

5. A semiconductor integrated circuit comprising:

a semiconductor substrate;

an input/output control circuit formed on the surface of said semiconductor substrate, said input/output control circuit having a signal input terminal, a control terminal, a first output terminal and a second output terminal;

a pre-driver circuit having first and second input terminals, third to eighth output terminals, first and second delay circuits, first and second two-input NOR gates, first and second two-input NAND gates and first to forth inverters, in said pre-driver circuit, first and second input terminals are connected to first and second output terminals of said input/output control circuit respectively, first and second input terminals are connected to fifth and sixth output terminals, first input terminal is connected to said first delay circuit and said first and second two-input NOR gates, said first delay circuit is connected to said second delay circuit, second input terminal is connected to said first and second two-input NAND gates, remaining input terminals of said first two-input NOR gate and said first two-input NAND gates are connected to the output terminal of said first delay circuit, remaining input terminals of said second two-input NOR gate and said second two-input NAND gates are connected to the output terminal of said second delay circuit, output terminal of said first two-input NOR gate is connected to said first inverter and output of said first inverter is connected to forth output terminal, output terminal of said second two-input NOR gate is connected to said second inverter and output of said second inverter is connected to third output terminal, output terminal of said first two-input NAND gate is connected to said third inverter and output of said third inverter is connected to seventh output terminal, output terminal of said second two-input NAND gate is connected to said forth inverter and output of said forth inverter is connected to eighth output terminal;

a main driver circuit having third to eighth input terminals and a ninth output terminal, three transistor groups, each of said transistor groups comprising a first conductor-type MOS transistor and a second conductor-type MOS transistor, in said main driver circuit, third to eight input terminals are connected to said third to eight output terminals of said pre-driver circuit respectively, ninth output terminal is connected to drain electrodes of the MOS transistors of said transistor groups, source electrode of first conductor type MOS transistor of first transistor group is connected to power supply and gate electrode is connected to fifth input terminal, source electrode of second conductor type MOS transistors of first transistor group is connected to ground and gate electrode is connected to sixth input terminal, source electrode of first conductor type MOS transistor of second transistor group is connected to power supply and gate electrode is connected to forth input terminal, source electrode of second conductor type MOS transistors of second transistor group is connected to ground and gate electrode is connected to seventh input terminal, source electrode of first conductor type MOS transistor of third transistor group is connected to power supply and gate electrode is connected to third input terminal, source electrode of second conductor type MOS transistors of third transistor group is connected to ground and gate electrode is connected to eighth input terminal;

a signal output terminal to which ninth output terminal of said main driver circuit is connected.

6. A semiconductor integrated circuit according to claim 5; wherein, said first and second inverter comprises a first conductor type MOS transistor and at least two second conductor type MOS transistors, in said first and second inverter, drain electrode of said first conductor type MOS transistor and drain electrode of one of said second conductor type MOS transistors is connected to each other to form an output terminal, source electrodes of said second conductor type MOS transistors are connected to each other, gate electrodes of all of the MOS transistors are connected to form an input terminal;

said third and forth inverter comprises at least two first conductor type MOS transistor and a second conductor type MOS transistors, in said third and forth inverter, drain electrode one of said first conductor type MOS transistor and drain electrode of said second conductor type MOS transistors is connected to each other to form an output terminal, source electrodes of said first conductor type MOS transistors are connected to each other, gate electrodes of all of the MOS transistors are connected to form an input terminal.

* * * * *